(12) United States Patent
Hasegawa

(10) Patent No.: US 6,980,403 B2
(45) Date of Patent: Dec. 27, 2005

(54) MAGNETIC SENSING ELEMENT WITH SIDE SHIELD LAYERS

(75) Inventor: Naoya Hasegawa, Niigata-ken (JP)

(73) Assignee: ALPS Electric Co., Ltd., Tokyo (JP)

( * ) Notice: Subject to any disclaimer, the term of this patent is extended or adjusted under 35 U.S.C. 154(b) by 160 days.

(21) Appl. No.: 10/384,815

(22) Filed: Mar. 10, 2003

(65) Prior Publication Data

US 2003/0174446 A1 Sep. 18, 2003

(30) Foreign Application Priority Data

Mar. 12, 2002 (JP) ............................. 2002-066594

(51) Int. Cl.[7] ................................................ G11B 5/39
(52) U.S. Cl. ................................................... 360/319
(58) Field of Search ........................................ 360/319

(56) References Cited

U.S. PATENT DOCUMENTS

| 6,061,211 A | 5/2000 | Yoda et al. |
| 6,115,216 A | 9/2000 | Yoda et al. |
| 6,680,829 B2 * | 1/2004 | Chen et al. ................. 360/319 |
| 6,680,832 B2 * | 1/2004 | Fontana et al. ............. 360/319 |
| 2003/0227725 A1 * | 12/2003 | Macken et al. ........ 360/324.12 |
| 2004/0156148 A1 * | 8/2004 | Chang et al. ............... 360/319 |

* cited by examiner

Primary Examiner—Robert S. Tupper
(74) Attorney, Agent, or Firm—Brinks Hofer Gilson & Lione

(57) ABSTRACT

A magnetic sensing element of a current-perpendicular-to-plane (CPP) type that minimizes an increase in effective read track width and prevents side reading is provided. The magnetic sensing element includes a composite film, an upper shield layer, a lower shield layer, and side shield layers. The side shield layers are disposed at the two sides of the composite film in the track width direction between the lower shield layer and the upper shield layer.

39 Claims, 16 Drawing Sheets

MAGNETIC SENSING ELEMENT WITH SIDE SHIELD LAYERS

This application claims the benefit of priority to Japanese Patent Application 2002-066594, filed on Mar. 12, 2002.

BACKGROUND OF THE INVENTION

1. Field of the Invention

The present invention relates generally to current-perpendicular-to-the-plane (CPP) magnetic sensing elements. In particular, it relates to a magnetic sensing element that can prevent the effective read track width from widening and that can inhibit side reading.

2. Description of the Related Art

FIG. 16 is a partial cross-sectional view of a conventional magnetic sensing element showing the structure viewed from the face of the magnetic sensing element that opposes a recording medium. Hereinafter, this face is referred to as the "recording-medium-opposing face" or, simply, the "opposing face".

Referring to FIG. 16, the magnetic sensing element includes a lower electrode layer 1 and a composite film 6 formed on the central part of the upper face of the lower electrode layer 1. The composite film 6 is constituted from an antiferromagnetic layer 2, a pinned magnetic layer 3, a nonmagnetic material layer 4, and a free magnetic layer 5, stacked in that order on the lower electrode layer 1. The width of the upper face of the composite film 6 in the track width direction (the X direction in the drawing) determines the optical track width O-Tw.

As shown in FIG. 16, insulating layers 7 are disposed at the two sides of the composite film 6 in the track width direction (the X direction in the drawing) and on the lower electrode layer 1. The insulating layers 7 are composed of, for example, $Al_2O_3$ or $SiO_2$.

An upper electrode layer 8 is formed on the insulating layers 7 and the composite film 6, as shown in FIG. 16.

The magnetic sensing element shown in FIG. 16 has electrode layers 1 and 8 formed under and above the composite film 6. A sensing current flows between the lower and upper electrode layers 1 and 8 in a direction perpendicular to the plane of each layer of the composite film 6. This structure is called a current-perpendicular-to-the-plane (CPP) structure.

Compared with current-in-the-plane (CIP) magnetic sensing elements in which a sensing current flows in a direction parallel to the surface of each layer of the composite, the CPP magnetic sensing element achieves higher output from narrower tracks. The CPP magnetic sensing element can meet the increasing demand for higher recording density.

As the recording density increases, the track becomes increasingly narrower, resulting in the following problems.

A magnetic head incorporating a magnetic sensing element reads a recorded magnetic field from a particular recording track on a recording medium while the magnetic head floats on the recording medium. At this time, even though the magnetic sensing element is not at a position opposite to recording tracks adjacent to this particular recording track (hereinafter, "the adjacent tracks"), leakage magnetic fields from the adjacent tracks, particularly those generated at the side regions of the composite film 6 in the track width direction, may reach the magnetic sensing element. As a result, the leakage magnetic fields at side regions of the composite film 6 may be detected. This is particularly problematic as the distance between the magnetic sensing element and the adjacent track becomes smaller.

Such a phenomenon does not pose problems if the optical track width O-Tw and the track pitch of the magnetic sensing element are large. However, as the optical track width O-Tw is reduced to 0.2 µm or less and the track pitch becomes smaller, the ratio of the magnitude of the leakage magnetic fields from the adjacent tracks to the magnitude of the magnetic field from the target recording track is increased. As a result, the effective read track width becomes significantly larger than the optical track width O-Tw, leading to a problem of side-reading. Thus, the magnetic sensing element is not suitable for use with high-density recording media.

SUMMARY OF THE INVENTION

In order to overcome the problems encountered in the conventional art, the present invention provides a magnetic sensing element which minimizes an increase in the effective read track width and properly prevents side reading.

The present invention provides a magnetic sensing element comprising a composite film comprising an antiferromagnetic layer, a pinned magnetic layer, a nonmagnetic material layer, and a free magnetic layer, an electrical current flowing in the composite in a direction perpendicular to the surface of each layer of the composite; a lower shield layer disposed at the bottom of the composite film, the lower shield layer extending beyond two side faces of the composite film in the track width direction; an upper shield layer disposed at the top of the composite film, the upper shield layer extending beyond the two side faces of the composite film in the track width direction; and two side shield layers respectively disposed at the two sides of the composite film between the lower shield layer and the upper shield layer.

According to this structure, the right side, the left side, the bottom, and the top of the composite film are surrounded by shielding layers. Thus, leakage magnetic fields from adjacent tracks can be properly absorbed by the side shield layers. An increase in effective track width can be minimized, and side reading can be suitably prevented.

Preferably, the composite film further comprises insulating layers disposed between the side shield layers and the side faces of the composite film. In a magnetic sensing element of a current-perpendicular-to-the-plane type, an electric current may shunt into side shield layers if the two side faces of the composite film and the side shield layers are in direct contact. Shunting results in a decrease in output, which is a problem.

This problem is particularly acute when the magnetic sensing element is of a tunneling magnetoresistive type having the nonmagnetic material layer composed of an insulating material. In this type of magnetic sensing element, an electric current may easily shunt into side shield layers instead of flowing into the pinned magnetic layer, the nonmagnetic material layer, and the free magnetic layer, resulting in a dramatic drop in output.

Preferably, the thickness of each insulating layer in the track width direction is 0.003 µm to 0.06 µm. In this manner, the effective read track width subtracted by the optical track width O-Tw can be reduced to 0.015 µm or less. Thus, an increase in the effective read track width is minimized, and side reading can be prevented.

More preferably, the thickness of each insulating layer in the track width direction is 0.003 µm to 0.03 µm. In this manner, the effective read track width subtracted by the optical track width O-Tw can be reduced to 0.01 μm or less.

Preferably, each of the side shield layers has a single-layer structure or a multilayer structure, and comprises a magnetic material having a resistivity higher than those of the pinned magnetic layer and the free magnetic layer. In this structure, particularly, when the side shield layers are in contact with the two side end faces of the composite film, an electric current can flow in the pinned magnetic layer, the nonmagnetic material layer, and the free magnetic layer without shunting into the side shield layers. Thus, an increase in output is achieved.

Preferably, each of the side shield layers has a single-layer structure or a multilayer structure, and comprises a magnetic material different from at least one of magnetic materials constituting the upper shield layer and the lower shield layer. The side shield layers may be separated from the upper shield layer and the lower shield layer. With this structure, the side shield layers can be made from a wide variety of materials. The side shield layers may be formed of a magnetic material having a resistivity higher than those of the lower shield layer and the upper shield layer.

Each of the side shield layers may include at least one sublayer comprising a Co-based amorphous material.

Preferably, each of the side shield layers comprises at least one sublayer comprising a magnetic material represented by Fe-M-O, wherein M is at least one element selected from Ti, Zr, Hf, Nb, Ta, Cr, Mo, Si, P, C, W, B, Al, Ga, Ge, and rare earth elements.

The Co-based amorphous material and Fe-M-O described above have a resistivity higher than that of the material, such as permalloy, used in the lower and upper shield layers. The Co-based amorphous material and Fe-M-O are sputtered to form the side shield layers. Whereas the lower and upper shield layers must have a large thickness and thus are formed of platable material such as permalloy (a NiFe alloy), the side shield layers have a small thickness and thus may be formed of sputterable materials as well as platable materials. The Co-based amorphous material is one of such examples.

In the present invention, each of the side shield layers may be an exchange-coupled film comprising an antiferromagnetic sublayer and a soft magnetic sublayer. Since the exchange-coupled film cannot function as the shield when the exchange coupling magnetic field is excessively strong, the magnitude of the exchange coupling magnetic field must be sufficiently small.

Preferably, the upper shield layer is in contact with an upper face of the composite film so that the upper shield layer can also function as an upper electrode. In this case, insulating layers are preferably provided between the upper shield layer and the side shield layers. With this structure, an electric current flowing from the upper shield layer to the composite film does not shunt into the side shield layers. Thus, output can be properly increased.

Preferably, the lower shield layer is in contact with a lower face of the composite film so that the lower shield layer can also function as the lower electrode layer. Insulating layers are preferably disposed between the lower shield layer and the side shield layers. With this structure, an electric current flowing from the lower shield layer to the composite film does not shunt into the side shield layers. Thus, output can be properly increased.

Only one of the upper face and the lower face of each side shield layer needs to be insulated. It is not necessary to provide insulation on both upper and lower face of each side shield layer.

When the composite is in direct contact with the lower shield layer and/or the upper shield layer, the gap length Gl, i.e., the distance between the upper and lower shield layers, can be decreased. This is particularly preferred to further increase the recording density. Moreover, since no separate electrode layer is necessary, shield layers can closely surround the composite film. As a result, leakage magnetic fields from adjacent tracks are absorbed by the shield layers, and an increase in the effective read track width can be effectively minimized.

In the present invention, the side shield layers may be integrated with one of the upper shield layer and the lower shield layer to form an integrated shield layer.

Preferably, the integrated shield layer includes a magnetic region comprising a Co-based amorphous material.

Preferably, the integrated shield layer includes a magnetic region comprising a magnetic material represented by Fe-M-O, wherein M is at least one element selected from Ti, Zr, Hf, Nb, Ta, Cr, Mo, Si, P, C, W, B, Al, Ga, Ge, and rare earth elements.

The upper shield layer is preferably in contact with an upper face of the composite film. The lower shield layer is preferably in contact with a lower face of the composite film.

Preferably, the composite film further comprises a nonmagnetic layer disposed on a face of the free magnetic layer remote from the nonmagnetic material layer; and a bias layer formed on the nonmagnetic layer. This structure is referred to as the "in-stack biasing structure", which can be suitably employed in a CPP magnetic sensing element. The in-stack biasing structure decreases the output resulting from shunting of a sensing current into the bias layer if employed in a current-in-the-plane (CPP) magnetic sensing element. In contrast, a CPP magnetic sensing element in which a current flows in a direction perpendicular to the surface of the each layer of the composite film, the instack biasing structure does not generate any shunting path. Thus, the output does not decrease. The in-stack biasing method described above is particularly effective in CPP magnetic sensing elements and can sufficiently meet the demand for narrower tracks.

In the present invention, the nonmagnetic material layer may be made of a nonmagnetic conductive material or an insulating material.

DESCRIPTION OF THE PREFERRED EMBODIMENTS

First Embodiment

Figure 1:
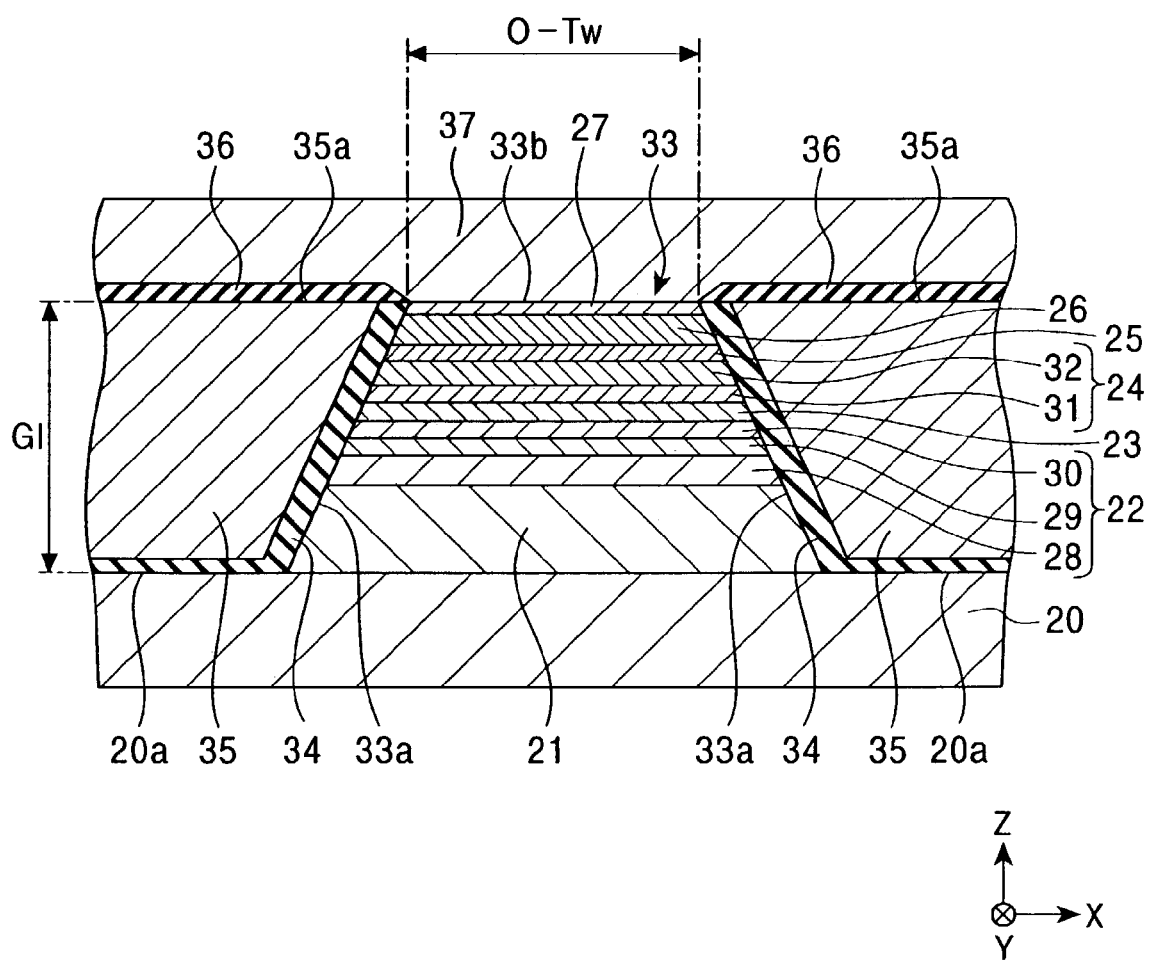
FIG. 1 is a cross-sectional view of a magnetic sensing element according to a first embodiment of the present invention viewed from a face of the magnetic sensing element that opposes a recording medium.

FIG. 1 is a cross-sectional view of a magnetic sensing element according to a first embodiment of the present invention viewed from a face of the magnetic sensing element that opposes a recording medium. Hereinafter, this face is referred to as the "recording-medium-opposing face" or, simply, the "opposing face". In FIG. 1, only central part of the element extending in the X direction is shown.

The magnetic sensing element (MR head) shown in FIG. 1 is for reading an external signal recorded on a recording medium. In the present invention, an inductive write head may be stacked on the magnetic sensing element.

The magnetic sensing element is disposed on a trailing end face of a slider composed of, for example, alumina-titanium carbide ($Al_2O_3$—TiC). In order to make a magnetic head device, the slider is joined to an elastic supporting member composed of, for example, stainless steel at the opposite side of the opposing face.

Referring now to FIG. 1, a lower shield layer 20 of this embodiment also functions as a lower electrode. The lower shield layer 20 is composed of a magnetic material such as a NiFe alloy (permalloy) or Fe—Al—Si (sendust). The lower shield layer 20 is formed by plating, sputtering, or the like. The lower shield layer 20 must have high permeability and low magnetostriction constant.

As shown in FIG. 1, an antiferromagnetic layer 21, a pinned magnetic layer 22, a nonmagnetic material layer 23, a free magnetic layer 24, a nonmagnetic layer 25, a bias layer 26 and a protective layer 27 are stacked in that order on the center of the upper face of the lower shield layer 20 in the X direction.

Alternatively, an underlayer (not shown) composed of at least one element selected from Ta, Hf, Nb, Zr, Ti, Mo, and W may be formed between the antiferromagnetic layer 21 and the lower shield layer 20. A seed layer (not shown) composed of, for example, Cr or NiFeCr may be provided between the underlayer and the antiferromagnetic layer 21 or between the antiferromagnetic layer 21 and the lower shield layer 20. By providing the seed layer, the crystal grain size of each layer formed on the seed layer becomes large in a direction parallel to the surface of the layer. Thus, the current-carrying reliability, e.g., the electromigration resistance, and the rate of change in resistance ($\Delta R/R$) can be improved.

The antiferromagnetic layer 21 formed on the lower shield layer 20 shown in FIG. 1 is preferably composed of an antiferromagnetic material containing Mn and X, wherein X is at least one element selected from the group consisting of Pt, Pd, Ir, Rh, Ru, and Os. Alternatively, the antiferromagnetic layer 21 may be composed of an antiferromagnetic material containing Mn, X, and X', wherein X is as defined in the above, and X' is at least one element selected from the group consisting of Ne, Ar, Kr, Xe, Be, B, C, N, Mg, Al, Si, P, Ti, V, Cr, Fe, Co, Ni, Cu, Zn, Ga, Ge, Zr, Nb, Mo, Ag, Cd, Sn, Hf, Ta, W, Re, Au, Pb, and rare earth elements.

The antiferromagnetic materials have high corrosion resistance and high blocking temperatures. With such materials, a large exchange anisotropic magnetic field can be generated at the interfaces with a magnetic sublayer 28 of the pinned magnetic layer 22 described below. The antiferromagnetic layer 21 preferably has a thickness of 80 Å to 300 Å.

In this embodiment, the pinned magnetic layer 22 on the antiferromagnetic layer 21 has a three-layer structure.

The pinned magnetic layer 22 is constituted from magnetic sublayers 28 and 30 and a nonmagnetic interlayer 29 composed of, for example, Ru. The nonmagnetic interlayer 29 is disposed between the magnetic sublayers 28 and 30. By this structure, the magnetization directions of the magnetic sublayers 28 and 30 become antiparallel to each other. This structure is called "synthetic ferrimagnetic structure". The nonmagnetic interlayer 29 is composed of at least one element selected from the group consisting of Ru, Rh, Ir, Cr, Re, and Cu. The nonmagnetic interlayer 29 is preferably composed of Ru.

An exchange anisotropic magnetic field is generated between the antiferromagnetic layer 21 and the magnetic sublayer 28 in contact with the antiferromagnetic layer 21 by in-magnetic-field annealing. For example, when the magnetization direction of the magnetic sublayer 28 is pinned in the height direction (the Y direction in the drawing), the magnetization direction of the magnetic sublayer 30 is pinned in a direction opposite to the height direction, i.e., a direction opposite to the Y direction in the drawing, by a Ruderman-Kittel-Kasuya-Yosida (RKKY) interaction. This structure can stabilize the magnetization directions of the pinned magnetic layer 22, and the apparent magnitude of the exchange anisotropic magnetic field generated between the pinned magnetic layer 22 and the antiferromagnetic layer 21 can be increased.

The thickness of the magnetic sublayers 28 and 30 are each approximately 10 to 70 Å, and the thickness of the nonmagnetic interlayer 29 is approximately 3 to 10 Å.

The magnetic sublayers 28 and 30 have different magnetic moments per unit area. A magnetic moment is the product of a saturation magnetization Ms and the thickness t. Because the magnetic sublayers 28 and 30 have different magnetic moments, an adequate synthetic ferrimagnetic structure is achieved.

Referring again to FIG. 1, the nonmagnetic material layer 23 is formed on the magnetic sublayer 30. The nonmagnetic material layer 23 is composed of a conductive material having a low electrical resistance such as Cu. The nonmagnetic material layer 23 has a thickness of, for example, approximately 25 Å.

When the nonmagnetic material layer 23 is composed of a nonmagnetic conductive material such as Cu, the magnetic sensing element shown in FIG. 1 functions as a CPP spin-valve giant magnetoresistive (GMR) element. Alternatively, the nonmagnetic material layer 23 may be composed of an insulating material such as $Al_2O_3$ or $SiO_2$. When the nonmagnetic material layer 23 is composed of an insulating material, the magnetic sensing element functions as a CPP spin-valve tunneling magnetoresistive (TMR) element that utilizes the tunneling magnetoresistive effect (TMR effect).

The free magnetic layer 24 is formed on the nonmagnetic material layer 23. In this embodiment, the free magnetic layer 24 has a two-layer structure. The thickness of the free magnetic layer 24 as a whole is preferably in the range of approximately 20 to 100 Å.

The free magnetic layer 24 is constituted from a magnetic sublayers 31 and 32. The magnetic sublayers 31 and 32 are each preferably composed of a CoFe alloy, a CoFeNi alloy, a NiFe alloy, or elemental Co. The magnetic sublayer 31 is more preferably composed of a CoFe alloy, and the magnetic sublayer 32 is more preferably composed of a NiFe alloy. The magnetic sublayer 31 functions as an anti-diffusion layer for preventing diffusion of the elements between the free magnetic layer 24 and the nonmagnetic material layer 23. Moreover, the rate of change in resistance ($\Delta R/R$) can be improved by forming the magnetic sublayer 31 with a CoFe alloy.

Referring to FIG. 1, the nonmagnetic layer 25 formed on the free magnetic layer 24 is preferably composed of a nonmagnetic conductive material. In particular, the nonmagnetic layer 25 is preferably composed at least one element selected from the group consisting of Ru, Rh, Ir, Cr, Re, and Cu. Alternatively, the nonmagnetic layer 25 may be composed of an insulating material such as $Al_2O_3$ or $SiO_2$. In such a case, it is necessary to reduce the thickness of the nonmagnetic layer 25 so that the current flowing between the upper shield layer and the lower shield layer 20 is not blocked at the nonmagnetic layer 25. The thickness of the nonmagnetic layer 25 is preferably 20 to 100 Å.

The bias layer 26 formed on the nonmagnetic layer 25 is composed of permanent magnet, for example. When the bias layer 26 is composed of permanent magnet, it is called a hard bias layer. The bias layer 26 is composed of a CoPtCr alloy, a CoPt alloy, or the like. Alternatively, the bias layer 26 may be an exchange-coupled film constituted from a soft magnetic sublayer and an antiferromagnetic sublayer.

In this embodiment, the free magnetic layer 24 is separated from the bias layer 26 by the nonmagnetic layer 25 therebetween. Longitudinal magnetic fields are supplied from the two side ends of the bias layer 26 to the free magnetic layer 24 so that the free magnetic layer 24 can be magnetized in the X direction in the drawing. Note that when the bias layer 26 is an exchange-coupled film, the longitudinal magnetic fields are supplied from the two side ends of the soft magnetic sublayer.

The protective layer 27 on the bias layer 26 is composed of a nonmagnetic material such as Ta.

It should be noted here that, in this specification, a composite constituted from layers from the antiferromagnetic layer 21 to the protective layer 27 shown in FIG. 1 is referred to as a composite film 33.

In this embodiment, as shown in FIG. 1, an insulating layer 34 is formed on each of two side end faces 33a of the composite film 33 in the track width direction (the X direction in the drawing) and on part of an upper face 20a of the lower shield layer 20 not overlaid by the composite film 33. The insulating layer 34 is composed of an insulating material such as $Al_2O_3$ or $SiO_2$ and is formed by sputtering, for example.

A side shield layer 35 is formed over each of the insulating layers 34. The side shield layer 35 is composed of a magnetic material. The layer structure and the materials of the side shield layer 35 will be described below in detail.

As shown in FIG. 1, an insulating layer 36 is formed on each side shield layer 35. The insulating layer 36 is composed of an insulating material such as $Al_2O_3$ or $SiO_2$ and formed by sputtering.

As shown in FIG. 1, an upper shield layer 37 is formed over the insulating layers 36 and the protective layer 27, which is the topmost layer of the composite film 33. In this embodiment, the upper shield layer 37 also functions as an upper electrode layer and is composed of a magnetic material. For example, the upper shield layer 37 is formed by plating or sputtering a NiFe alloy (permalloy) or sendust.

In this embodiment, the distance between the lower shield layer 20 and the upper shield layer 37, i.e., the distance in the Z direction between the lower face of the 21 and the upper face of the protective layer 27, is the gap length Gl.

In the magnetic sensing element shown in FIG. 1, the lower shield layer 20 and the upper shield layer 37 are in contact with the bottom and the top of the composite film 33, respectively. A current flows between the lower shield layer 20 and the upper shield layer 37 in a direction perpendicular to the surface of each layer of the composite film 33, i.e., in the Z direction. This structure is called the current-perpendicular-to-the-plane (CPP) structure.

The features of the magnetic sensing element shown in FIG. 1 will now be described. As shown in FIG. 1, the side shield layers 35 are formed at the two sides of the composite film 33 in the track width direction (the X direction) between the lower shield layer 20 and the upper shield layer 37.

According to this structure, shield layers substantially surround the composite film 33. Thus, leakage magnetic fields from the adjacent tracks of the recording medium can be adequately absorbed by the side shield layers 35, thereby preventing the leakage magnetic fields from entering the composite film 33.

In the embodiment shown in FIG. 1, the width of the upper face of the composite film 33 in the track width direction (the X direction in the drawing) is the optical track width O-Tw. The optical track width O-Tw is a width measured by an optical microscope or an electron microscope.

In contrast, the effective read track width (sometimes referred to as the "magnetic read track width") is determined by, for example, a full-track profile method or a micro-track profile method.

Figure 15:
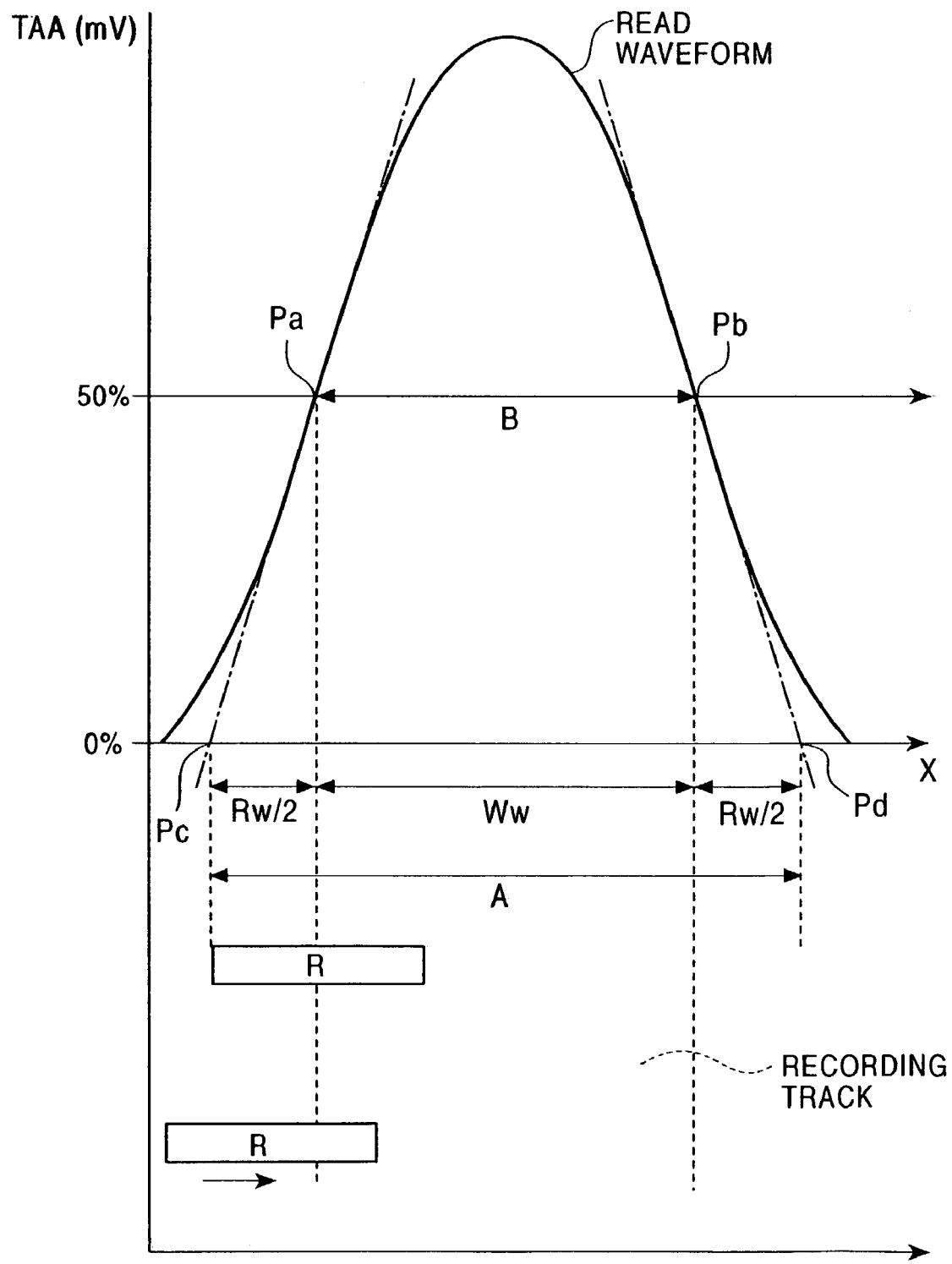
FIG. 15 is a diagram that explains a method for determining the effective read track width according to an off-track profile method.

Referring now to FIG. 15, a full-track profile method is explained. A signal is recorded on a recording track of a recording medium. Here, the recording track has a width Ww larger than the width of the magnetic sensing element R. While the magnetic sensing element scans in the track width direction (the X direction) on the recording track, the relationship between the position of the magnetic sensing element in the recording track width direction (the X direction) and the output is determined. The results are shown in the upper part of the graph in FIG. 15.

According to the read waveform, output is high at the central area of the recording track and decreases as the magnetic sensing element moves away from the center of the recording track.

Tangential lines are drawn from points Pa and Pb indicating 50% of the maximum output of the read waveform.

The intersections of the tangential lines and the X axis are defined as points Pc and Pd. The difference Rw between the distance A between the points Pc and Pd and the distance (half-value width) B between the points Pa and Pb is the effective read track width. Here, the half-value width B is the effective recording track width Ww.

The effective read track width is the width of the region that actually functions as the track width. Ideally, the effective read track width is equal to the optical track width O-Tw.

In the present invention, the side shield layers 35 disposed at the two sides of the composite film 33 in the track width direction (the X direction in the drawing) properly absorb leakage magnetic fields applied from adjacent tracks on the recording media. Thus, the amount of leakage magnetic field entering the composite film 33 is smaller compared to the conventional technology. Moreover, the effective read track width is close to the optical track width O-Tw when compared with the conventional technology. Accordingly, the present invention minimizes an increase in effective read track width and effectively reduces defective operations such as side reading.

In order to minimize an increase in effective read track width, the present invention has the following features.

The distance between the side end face 33a and the side shield layer 35 in the track width direction (the X direction in the drawing) is optimized. In this embodiment, the insulating layer 34 is disposed between the side end face 33a of the composite film 33 and the side shield layer 35. By controlling the thickness of the insulating layer 34, the increase in effective read track width is properly inhibited.

The thickness of the insulating layer 34 in the track width direction (the X direction in the drawing) between the side end face 33a and the side shield layer 35 is preferably 0.06 $\mu$m or less. According to this structure, the difference between the effective read track width and the optical track width O-Tw is reduced to 0.015 $\mu$m or less. This is confirmed from the experiment described below.

The thickness of the insulating layer 34 between the side end face 33a and the side shield layer 35 in the track width direction (the X direction) is more preferably 0.03 $\mu$m or less. In this manner, the difference between the effective read track width and the optical track width O-Tw is reduced to 0.01 $\mu$m or less. This is confirmed from the experiment described below.

An increase in effective read track width can be minimized and side reading can be effectively prevented by adjusting the thickness of the insulating layer 34 disposed between the side end face 33a and the side shield layer 35.

The thickness of the insulating layer 34 in the track width direction (the X direction) that covers the side end face 33a is preferably at least 0.003 $\mu$m. The insulating layer 34 is provided to prevent the current flowing in the composite film 33 in a direction perpendicular to the layer surface from shunting into the side shield layers 35. Thus, the insulating layer 34 must be sufficiently thick, i.e., at least 0.003 $\mu$m.

When the nonmagnetic material layer 23 of the composite film 33 is composed of an insulating material such as $Al_2O_3$ or $SiO_2$ and the magnetic sensing element is thus of a tunneling magnetoresistive type, the presence of the insulating layers 34 between the side faces 33a of the composite film 33 and the side shield layers 35 is important. If the side shield layers 35 are in direct contact with the side end face 33a, a current flowing between the free magnetic layer 24 and the pinned magnetic layer 22 in a direction perpendicular to the layer surface of the composite film 33 mostly shunts into the side shield layers 35 having an electrical resistance smaller than that of the nonmagnetic material layer 23 composed of an insulating material. This results in a dramatic decrease in output.

Even when the magnetic sensing element is of a spin-valve GMR type comprising the nonmagnetic material layer 23 composed of a nonmagnetic conductive material such as Cu, the insulating layer 34 is preferably disposed between each side end face 33a of the composite film 33 and the corresponding side shield layer 35 so as to prevent the current from shunting. However, the necessity of the insulating layers 34 is less compared to the tunneling magnetoresistive element. Whether the insulating layers 34 should be formed cannot be determined from the type of magnetic sensing element alone. The material of the side shield layers 35 is also an important factor. For example, when the resistivity of the side shield layers 35 is smaller than that of the free magnetic layer 24 and the pinned magnetic layer 22 of the composite film 33, a current readily shunts into the side shield layers 35 if the side faces 33a and the side shield layers 35 are in direct contact. In view of the above, the side shield layers 35 are preferably composed of a magnetic material having a resistivity higher than those of the pinned magnetic layer 22 and the free magnetic layer 24 of the composite film 33.

In this embodiment shown in FIG. 1, the lower shield layer 20 is in contact with the lower face of the composite film 33 and functions as a lower electrode. Alternatively, a separate lower electrode may be formed in addition to the lower shield layer 20. Such a structure is a seventh embodiment of the present invention described below.

In this embodiment, since the lower shield layer 20 also functions as the lower electrode, no separate lower electrode layer is necessary. Thus, the magnetic sensing element manufacturing process can be simplified, the gap length Gl, which is the distance between the lower shield layer 20 and the upper shield layer 37 in the Z direction, can be shortened, and a magnetic sensing element suitable for use with higher recording density media can be manufactured.

Moreover, since the lower shield layer 20 is in contact with the composite film 33, leakage magnetic fields from the adjacent tracks entering the composite film 33 in the Y direction and particularly the leakage magnetic fields around the lower face of the composite film 33 can be effectively absorbed by the lower shield layer 20. As a result, a magnetic sensing element having superior read characteristics with less side reading can be obtained.

In this embodiment shown in FIG. 1, the upper shield layer 37 is in contact with upper face of the composite film 33. Thus, leakage magnetic fields from the adjacent tracks entering the composite film 33 in the Y direction and particularly the leakage magnetic fields around the upper face of the composite film 33 can be effectively absorbed by the upper shield layer 37. As a result, a magnetic sensing element having superior read characteristics with less side reading can be obtained.

Since the lower shield layer 20 and the upper shield layer 37 also functioning as the lower electrode and the upper electrode, respectively, are under and above the composite film 33 and are in contact with the composite film 33, the composite film 33 can be closely surrounded by the shield layers 20, 35, and 37. A magnetic sensing element having such a structure does not pick up excess leakage magnetic field from recording media, suffers less from side reading, and exhibits higher linear resolution.

For example, a magnetic sensing element of a CIP type in which a current flows in a direction parallel to the surface of each layer of the composite film 33 cannot incorporate the structure shown in FIG. 1. This is because the lower shield layer 20 and the upper shield layer 37 cannot be used as electrode layers. Moreover, generally, a CIP magnetic sensing element has hard bias layers disposed at the two sides of the free magnetic layer. For example, an exchange bias magnetic sensing element has an antiferromagnetic layer on the free magnetic layer 24; however, the composite film of this element does not have a substantially trapezoidal shape as shown in FIG. 1 but has a width in the track width direction longer than the optical width O-Tw, and no space is available for the side shield layers 35. Thus, it is not possible to surround the composite film by the side shielding layers.

In this embodiment shown in FIG. 1, the bias layer 26 is stacked on the nonmagnetic layer 25 on the free magnetic layer 24. A longitudinal magnetic field is applied to the free magnetic layer 24 from the bias layer 26 so as to put the free magnetic layer 24 in a single-magnetic-domain state in the X direction.

This biasing method is called a "in-stack biasing method" and is only applicable to CPP magnetic sensing elements. In CPP magnetic sensing elements, an electric current flows in a direction perpendicular to the surface of each layer of the composite film 33; accordingly, the free magnetic layer 24 above the bias layer 26 does not serve as a path for shunting current. In contrast, in a CIP magnetic sensing element, a current flows in a direction parallel to the surface of each layer of the composite film 33. Accordingly, if the in-stack biasing method is employed in the CIP magnetic sensing element, the current flowing in the bias layer 26 becomes shut loss, resulting in a decrease in output. The in-stack biasing method is effective only for CPP magnetic sensing elements. A magnetic sensing element employing the in-stack biasing method can be suitably used for reading narrow tracks.

If the longitudinal bias magnetic field applied from the bias layer 26 to the free magnetic layer 24 is excessively large, the magnetization direction of the free magnetic layer 24 is firmly oriented in the track width direction and is thus inhibited from rotating in response with an external magnetic field. Accordingly, the magnitude of the longitudinal bias magnetic field must be adjusted at an adequate range. The magnitude of the longitudinal bias magnetic field is affected by the thickness of the nonmagnetic layer 25 disposed between the bias layer 26 and the free magnetic layer 24. The thinner the nonmagnetic layer 25, the larger the intensity of the longitudinal bias magnetic field. The thickness of the nonmagnetic layer 25 must be optimized to control the magnitude of the longitudinal bias magnetic field applied from the bias layer 26 to the free magnetic layer 24. In the present invention, the thickness of the nonmagnetic layer 25 is preferably 0.002 to 0.01 $\mu$m.

Next, as shown in FIG. 1, the insulating layers 34 are also formed on the upper face 20a of the lower shield layer 20. In other words, the side shield layers 35 are separated from the lower shield layer 20 by the insulating layers 34 therebetween. This structure prevents an electric current flowing between the lower shield layer 20 and the upper shield layer 37 from shunting from the lower shield layer 20 into the side shield layers 35. Accordingly, a magnetic sensing element with large output can be manufactured. The thickness of the insulating layers 34 between the lower shield layer 20 and the side shield layers 35 is preferably 0.003 $\mu$m to 0.01 $\mu$m.

In this embodiment shown in FIG. 1, the insulating layers 36 are formed between the side shield layers 35 and the upper shield layer 37. The insulating layers 36 are composed of an insulating material such as $Al_2O_3$ or $SiO_2$. According to this structure, an electric current flowing between the upper shield layer 37 and the lower shield layer 20 is prevented from shunting from the upper shield layer 37 to the side shield layers 35. Accordingly, a magnetic sensing element with large output can be manufactured. The thickness of the insulating layers 36 between the upper shield layer 37 and the side shield layers 35 is preferably 0.003 to 0.1 $\mu$m.

Next the material of the side shield layer 35 is explained. The material of the side shield layers 35 may be the same as or different from that of the lower shield layer 20 or the upper shield layer 37.

As shown in FIG. 1, the side shield layers 35 are not in direct contact with the lower shield layer 20 and the upper shield layer 37. Thus, the side shield layers 35 may be composed of a material different from that of the upper shield layer 37 or the lower shield layer 20.

The side shield layers 35 composed of a material different from that of the upper shield layer 37 or the lower shield layer 20 can be manufactured as follows.

The lower shield layer 20 and the upper shield layer 37 have a large thickness and are generally made by plating using, for example, a permalloy (a NiFe alloy). In contrast, the thickness of the side shield layers 35 is dramatically small when compared with that of the lower shield layer 20 and the upper shield layer 37; accordingly, it is possible to form the side shield layers 35 using a material suited for sputtering or vapor deposition. Although the side shield layers 35 in FIG. 1 are depicted to have a larger thickness than that of the lower shield layer 20 or the upper shield layer 37, the thickness of the side shield layers 35 is smaller than that of the lower shield layer 20 or the upper shield layer 37 in an actual product. In particular, whereas the thickness of the lower shield layer 20 and the upper shield layer 37 is approximately 1 $\mu$m to 3 $\mu$m, the thickness of the side shield layer 35 is approximately 0.01 $\mu$m to 0.1 $\mu$m. The thickness of the side shield layer 35 becomes smaller as the gap length Gl becomes smaller.

Since the side shield layers 35 can be made by sputtering, the selection range of the material for the side shield layers 35 is wide.

The side shield layers 35 may be made a soft magnetic material such as a NiFe alloy having a nickel content of approximately 80 at %. The side shield layers 35 must have high permeability and a low magnetostriction constant, and a material that can provide such characteristics must be selected. Note that the lower shield layer 20 and the upper shield layer 37 must also exhibit these characteristics.

Examples of the soft magnetic material, other than the NiFe alloy having a nickel content of approximately 80 at %, include a Co-based amorphous material or a magnetic material represented by Fe-M-O, wherein M is at least one element selected from Ti, Zr, Hf, Nb, Ta, Cr, Mo, Si, P, C, W, B, Al, Ga, Ge, and rare earth elements. The side shield layers 35 may be formed by sputtering or vapor-depositing any of these materials.

An example of Co-based amorphous material is Co—X, wherein X is at least one element selected from Ti, Mo, W, Si, P, Zr, Nb, Hf, Ta, and B. The magnetic material, Fe-M-O, has a mixed-phase structure including both an amorphous phase and a bcc-Fe microcrystal phase.

The Co-based amorphous material and Fe-M-O have a resistivity higher than that of a NiFe alloy. In this embodiment shown in FIG. 1, the side shield layers 35 are preferably made from a Co-based amorphous material having a high resistivity, although the insulating layers 34 are disposed between the side end faces 33a of the composite film 33 and the side shield layers 35. This is because the current can be more effectively prevented from shunting into the side shield layers 35 from the composite film 33.

The resistivity of the side shield layers 35 is preferably higher than that of the free magnetic layer 24 or the pinned magnetic layer 22 of the pinned magnetic layer 22. In this manner, current loss caused by shunting to the side shield layers 35 can be properly reduced, and a magnetic sensing element having a high output can be manufactured. The side shield layer 35 composed of a Co-based amorphous material or an Fe-M-O material has a resistivity higher than that of the free magnetic layer 24 or the pinned magnetic layer 22 composed of a magnetic material such as a NiFe alloy. Specifically, the resistivity of the side shield layers 35 is approximately 100 to 100,000 $\mu\Omega\cdot$cm.

The position of upper faces 35a of the side shield layers 35 will now be described. As shown in FIG. 1, each upper face 35a of the side shield layer 35 is preferably positioned at a height level with an upper face 33b of the composite film 33 or at a height above the upper face 33b. This structure ensures that the two sides of the composite film 33 in the track width direction (the X direction) oppose the side shield layers 35 with the insulating layer 34 therebetween. Accordingly, an increase in effective read track width can be effectively minimized, and side reading can be prevented.

Alternatively, the position of the upper face 35a of the side shield layer 35 may be below the upper face 33b of the composite film 33. An increase in the effective read track width and side reading can still be prevented compared to a conventional magnetic sensing element that does not have any side shield layers. Preferably, when the upper face 35a is below the upper face 33b, the side shield layers 35 should be formed in such a way that the side shield layers 35 at least oppose the two side ends of the free magnetic layer 24.

The side shield layer 35 must have uniaxial anisotropy such that the track width direction (the X direction) becomes the magnetization easy axis. The lower shield layer 20 and the protective layer 27 must also have such uniaxial anisotropy. The side shield layers 35 are formed by in-magnetic-field sputtering or annealed in a magnetic field so as to exhibit such uniaxial anisotropy. In this manner, the side shield layers 35 has an enhanced shielding function and can effectively minimize an increase in effective read track width of the magnetic sensing element. Furthermore, the instability in read waveform resulting from instability in the magnetic domain structure of the shielding layers can be avoided.

Second Embodiment

Figure 2:
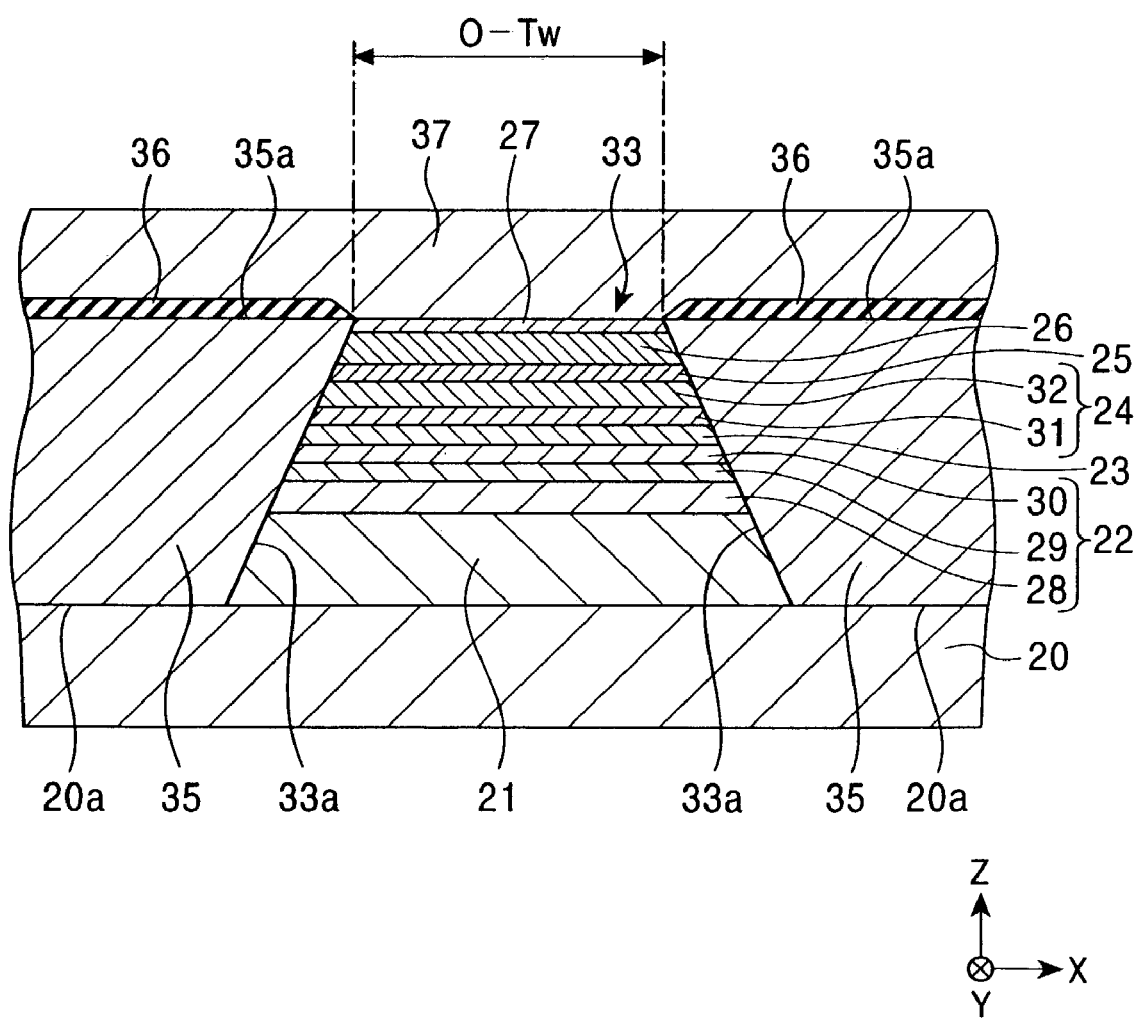
FIG. 2 is a cross-sectional view of a magnetic sensing element according to a second embodiment of the present invention viewed from the opposing face.

FIG. 2 is a cross-sectional view of a magnetic sensing element according to a second embodiment of the present invention viewed from the opposing face. In FIG. 2, only central part of the element extending in the X direction is shown.

The second embodiment in FIG. 2 differs from the first embodiment in FIG. 1 in that the second embodiment does not include the insulating layers 34 covering the side end faces 33a of the composite film 33 and the top face 20a of the lower shield layer 20 not overlaid by the composite film 33.

The second embodiment shown in FIG. 2 is particularly suited for use as a spin-valve GMR sensing element having the nonmagnetic material layer 23 composed of a nonmagnetic conductive material. In particular, the current flowing between the lower shield layer 20 and the upper shield layer 37 via the composite film 33 in a direction perpendicular to the surface of each layer of the composite film 33 rarely shunts into the side shield layers 35, and a large output can be obtained.

Referring to FIG. 2, the side shield layers 35 are in direct contact with the side faces 33a of the composite film 33. Whereas the nonmagnetic material layer 23 of the first embodiment was composed an insulating material, an electric current flowing between the free magnetic layer 24 and the pinned magnetic layer 22 of this embodiment rarely shunts into the side shield layer 35 having high electrical resistance instead of flowing into the nonmagnetic material layer 23 composed of a low-resistance material such as Cu. Thus, this embodiment does not require the insulating layers 34 on the side faces 33a of the composite film 33. Such a structure can prevent an increase in effective read track width and occurrence of side reading.

In the second embodiment show in FIG. 2, the side shield layers 35 are preferably made of a magnetic material having a resistivity higher than those of the pinned magnetic layer 22 and the free magnetic layer 24. In this manner, an electrical current flowing in a direction perpendicular to the surface of each layer of the composite film 33 rarely shunts into the side shield layers 35.

In this embodiment shown in FIG. 2, the side shield layers 35 are preferably composed of a Co-based amorphous material or a magnetic material represented by Fe-M-O, wherein M is at least one element selected from Ti, Zr, Hf, Nb, Ta, Cr, Mo, Si, P, C, W, B, Al, Ga, Ge, and rare earth elements.

These magnetic materials have a resistivity higher than that of a NiFe alloy or a CoFe alloy used in the free magnetic layer 24 and the pinned magnetic layer 22. The side shield layers 35 composed of a Co-based amorphous material or a Fe-M-O material can effectively eliminate shunt loss resulting from shunting into the side shield layers. Thus, a magnetic sensing element having a large read output can be obtained.

In the second embodiment shown in FIG. 2, the insulating layers 36 formed on the upper faces 35a of the side shield layers 35 separate the upper shield layer 37 from the side shield layers 35. This structure prevents an electrical current flowing from the upper shield layer 37 to the composite film 33 from shunting into the side shield layers 35. Moreover, the output can be further increased.

Third Embodiment

Figure 3:
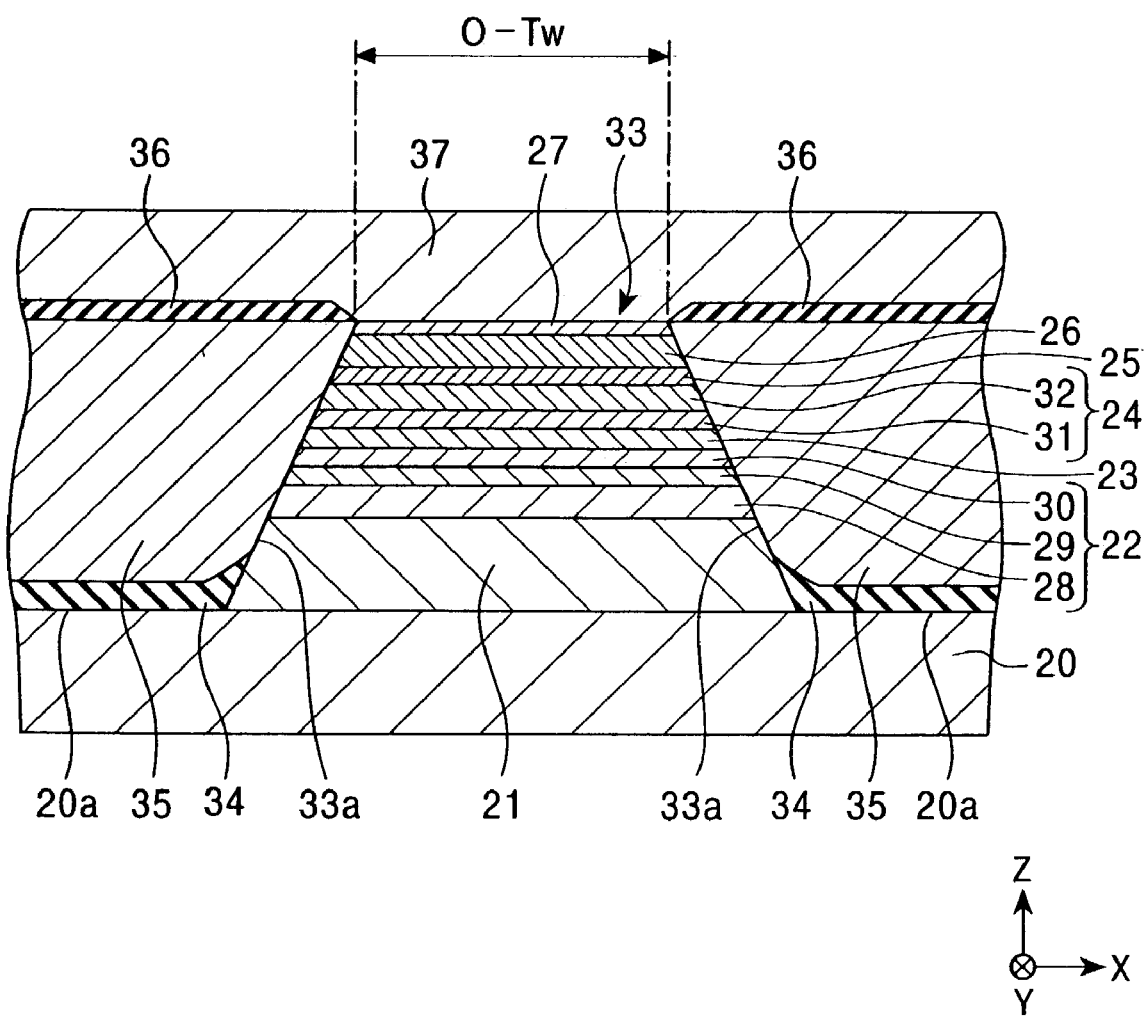
FIG. 3 is a cross-sectional view of a magnetic sensing element according to a third embodiment of the present invention viewed from the opposing face.

FIG. 3 is a cross-sectional view of a magnetic sensing element according to a third embodiment of the present invention viewed from the opposing face. The insulating layers 34 are formed over the top face 20a of the lower shield layer 20 not overlaid by the composite film 33. This structure prevents an electrical current flowing from the lower shield layer 20 to the composite film 33 from shunting into the side shield layers 35, thereby further increasing the output.

Alternatively, the insulating layer may be formed only between the lower shield layer 20 and the side shield layers 35 and not between the upper shield layer 37 and the side shield layers 35.

Alternatively, no insulating layer may be formed between the lower shield layer 20 and the side shield layers 35 and between the upper shield layer 37 and the side shield layers 35.

Fourth Embodiment

Figure 4:
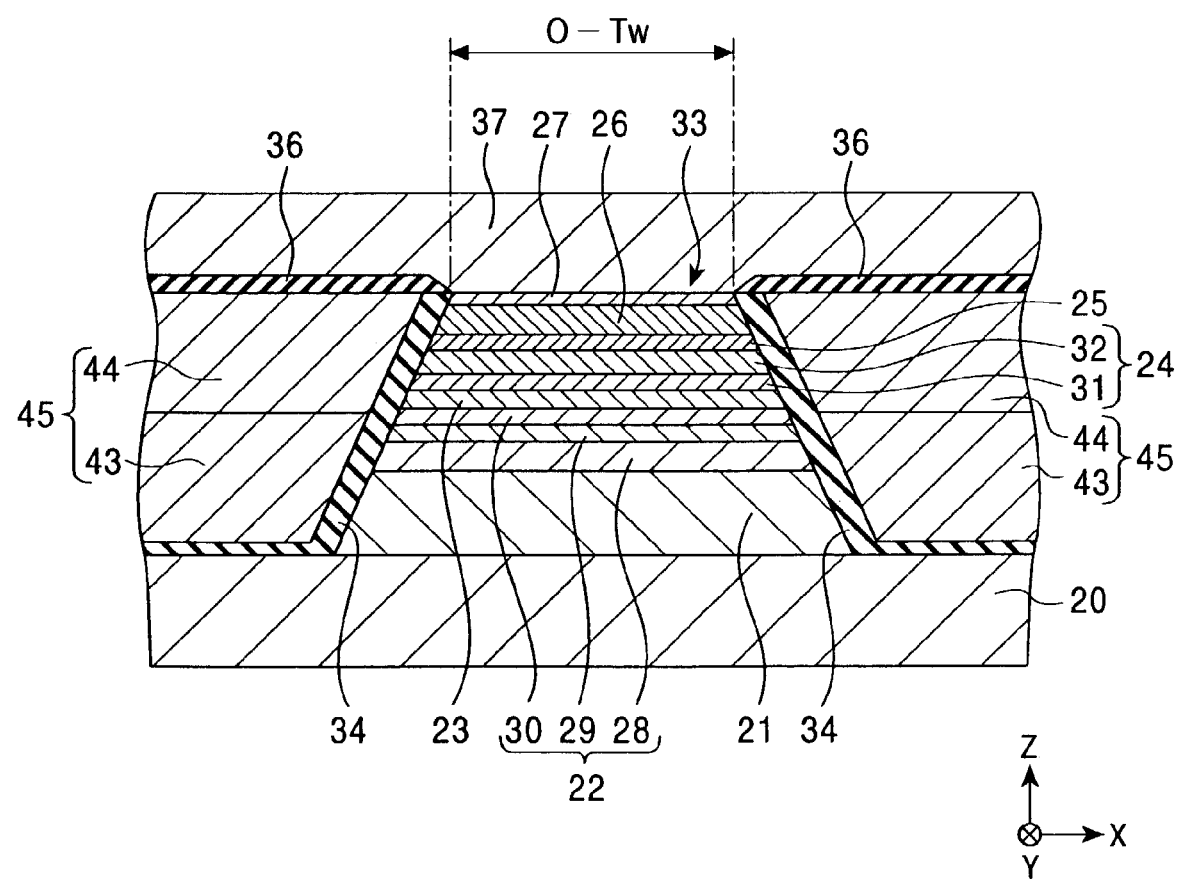
FIG. 4 is a cross-sectional view of a magnetic sensing element according to a fourth embodiment of the present invention viewed from the opposing face.

FIG. 4 is a cross-sectional view of a magnetic sensing element according to a fourth embodiment of the present invention viewed from the opposing face.

In the first to third embodiments shown in FIGS. 1 to 3, each side shield layer 35 is a single layer composed of a magnetic material. The fourth embodiment shown in FIG. 4 has side shield layers 45 each constituted from a first shield sublayer 43 and a second shield sublayer 44.

For example, the first shield sublayer 43, which is at the bottom of the second shield sublayer 44, is composed of an NiFe alloy, and the second shield sublayer 44 is composed of a Co-based amorphous material or a magnetic material represented by Fe-M-O, wherein M is at least one element selected from Ti, Zr, Hf, Nb, Ta, Cr, Mo, Si, P, C, W, B, Al, Ga, Ge, and rare earth elements.

An electrical current is prevented from shunting into the side shield layers 45 when the second shield sublayer 44 is composed of a material having a resistivity higher than that of the first shield sublayer 43. In this manner, a magnetic sensing element having a high output can be obtained. This structure is particularly effective when no insulating layer is formed at the side faces 33a of the composite film 33, as shown in FIGS. 2 and 3.

Ideally, the second shield sublayer 44 is composed of a magnetic material that has both high resistivity and superior shielding properties, i.e., high permeability and low magnetostriction constant. However, a magnetic material having high resistivity may have, for example, permeability lower than that of the lower shield layer 20 and the upper shield layer 37. In such a case, a magnetic material having good shielding properties is used to form the first shield sublayer 43. This structure prevents leakage magnetic fields applied from adjacent tracks of the recording medium from entering the composite film 33. Thus, an increase in effective read track width can be minimized, side reading can be prevented, and a magnetic sensing element free of shunting loss with higher output can be manufactured.

Although each of the side shield layers 45 of the fourth embodiment shown in FIG. 4 has a two-layer structure comprising the first shield sublayer 43 and the second shield sublayer 44, the side shield layers 45 may be constituted from three or more sublayers.

Fifth Embodiment

Figure 5:
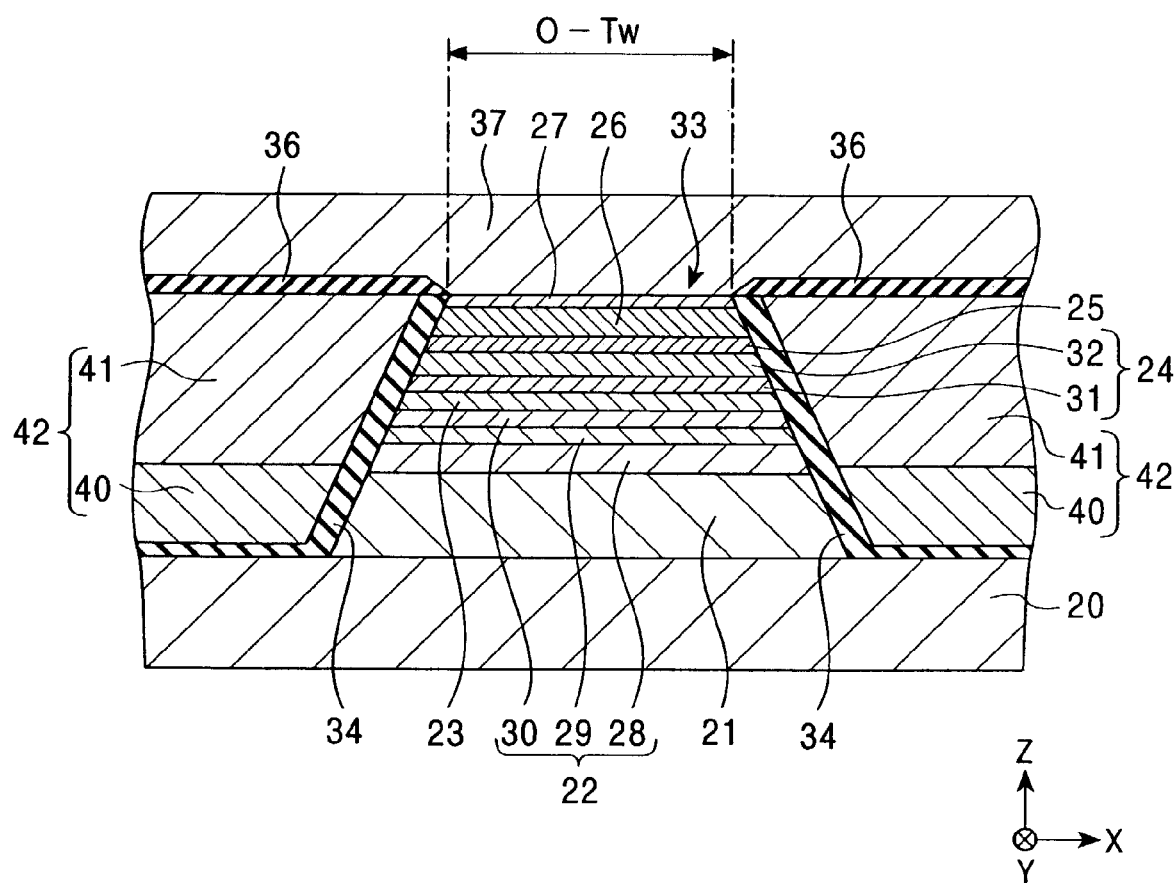
FIG. 5 is a cross-sectional view of a magnetic sensing element according to a fifth embodiment of the present invention viewed from the opposing face.

FIG. 5 is a cross-sectional view of a magnetic sensing element according to a fifth embodiment of the present invention viewed from the opposing face.

Referring to FIG. 5, the magnetic sensing element of the fifth embodiment differs from the magnetic sensing elements of the first to fourth embodiments shown in FIGS. 1 to 4 in that each side shield layer 42 is an exchange-coupled film constituted from an antiferromagnetic sublayer 40 and a soft magnetic sublayer 41.

Each side shield layer 42 is not in direct contact with the lower shield layer 20 or the upper shield layer 37, as shown in FIG. 5. Such a structure permits the use of the exchange-couple film constituted from the antiferromagnetic sublayer 40 and the soft magnetic sublayer 41.

The antiferromagnetic sublayer 40 may be composed of the same material as that of the antiferromagnetic layer 21 of the composite film 33. The antiferromagnetic sublayer 40 may be composed of an antiferromagnetic material containing Mn and X, wherein X is at least one element selected from the group consisting of Pt, Pd, Ir, Rh, Ru, and Os. Alternatively, the antiferromagnetic sublayer 40 may be composed of an antiferromagnetic material containing IrMn or Mn, X, and X', wherein X is as defined in the above, and X' is at least one element selected from the group consisting of Ne, Ar, Kr, Xe, Be, B, C, N, Mg, Al, Si, P, Ti, V, Cr, Fe, Co, Ni, Cu, Zn, Ga, Ge, Zr, Nb, Mo, Ag, Cd, Sn, Hf, Ta, W, Re, Au, Pb, and rare earth elements.

Alternatively, the antiferromagnetic sublayer 40 may be composed of NiMn, $\alpha$-$Fe_2O_3$, or FeMn. An exchange coupling magnetic field can be generated between the antiferromagnetic sublayer 40 and the soft magnetic sublayer 41 without annealing when FeMn is used to form the antiferromagnetic sublayer 40.

Unlike the antiferromagnetic layer 21 of the composite film 33, the antiferromagnetic sublayer 40 is not provided to firmly magnetize the soft magnetic sublayer 41 formed on the antiferromagnetic sublayer 40, but to produce uniaxial anisotropy in the soft magnetic sublayer 41. If the soft magnetic sublayer 41 is firmly magnetized and the magnetization of the soft magnetic sublayer 41 is pinned as in the pinned magnetic layer 22, the soft magnetic sublayer 41 cannot function cannot function as the side shield layer.

Generally, an exchange coupling magnetic field generated between the antiferromagnetic sublayer 40 and the soft magnetic sublayer 41 increases as the thickness of the antiferromagnetic sublayer 40 increases and the thickness of the soft magnetic sublayer 41 decreases. The thicknesses of the antiferromagnetic sublayer 40 and the soft magnetic sublayer 41 must be optimized so that a moderate exchange coupling magnetic field is applied to the soft magnetic sublayer 41 to produce uniaxial anisotropy or unidirectional anisotropy. For example, the thickness of the antiferromagnetic sublayer 40 is approximately 50 to 100 Å, and the thickness of the soft magnetic sublayer 41 is approximately 200 to 1,000 Å.

The soft magnetic sublayer 41 may be made of a conventional ferromagnetic material such as a NiFe alloy, a CoFe alloy, or CoFeNi alloy. Alternatively, the soft magnetic sublayer 41 may be composed of a Co-based amorphous material or a magnetic material such as Fe-M-O wherein M is at least one element selected from Ti, Zr, Hf, Nb, Ta, Cr, Mo, Si, P, C, W, B, Al, Ga, Ge, and rare earth elements.

The soft magnetic sublayer 41 need not have a single-layer structure. The soft magnetic sublayer 41 may be constituted from two or more sublayers.

The exchange coupling magnetic field generated between the antiferromagnetic sublayer 40 and the soft magnetic sublayer 41 by in-magnetic field deposition or in-magnetic-field annealing produce uniaxial anisotropy or unidirectional anisotropy in the X direction in the soft magnetic sublayer 41. The soft magnetic sublayer 41 then functions as a side shield layer.

Alternatively, the insulating layer 34 between the side shield layer 42 and the side end face 33a of the composite film 33 need not be formed.

Sixth Embodiment

Figure 6:
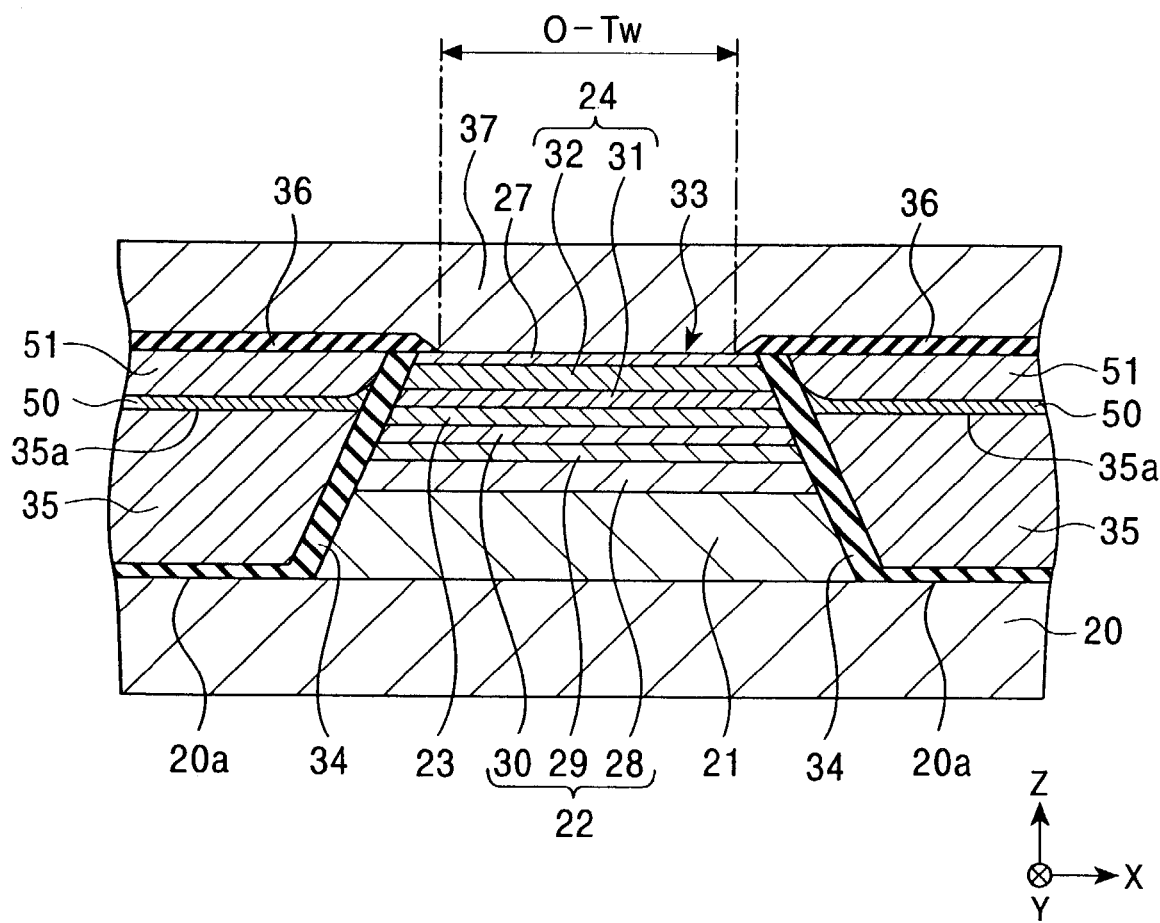
FIG. 6 is a cross-sectional view of a magnetic sensing element according to a sixth embodiment of the present invention viewed from the opposing face.

FIG. 6 is a cross-sectional view of a magnetic sensing element according to a sixth embodiment of the present invention viewed from the opposing face.

In this embodiment shown in FIG. 6, the insulating layers 34 are formed over the side faces 33a of the composite film 33 and part of the top face 20a of the lower shield layer 20 not overlaid by the composite film 33. The side shield layers 35 are formed on the insulating layers 34. A bias underlayer 50 is formed on each of the side shield layer 35, and a hard bias layer 51 is formed on the bias underlayer 50.

Unlike the first to fifth embodiments shown in FIGS. 1 to 5, the sixth embodiment shown in FIG. 6 does not employ a structure in which the bias layer 26 is stacked on the free magnetic layer 24 with the nonmagnetic layer 25 therebetween. The composite film 33 of this embodiment shown in FIG. 6 is constituted from the antiferromagnetic layer 21, the pinned magnetic layer 22, the nonmagnetic material layer 23, the free magnetic layer 24, and the protective layer 27, stacked in that order on the lower shield layer 20.

As shown in FIG. 6, the hard bias layers 51 are disposed at the two sides of the free magnetic layer 24 in the track width direction (the X direction). A longitudinal bias magnetic field from the hard bias layer 51 puts the free magnetic layer 24 into a single-magnetic-domain state in the X direction.

In the embodiment shown in FIG. 6, the upper face 35a of each side shield layer 35 is below the lower face of the free magnetic layer 24. The thickness of the side shield layers 35 at the sides of the composite film 33 is preferably as large as possible. However, if the upper face 35a of the side shield layer 35 is positioned above the lower face of the free magnetic layer 24, the thickness of the hard bias layers 51 decreases. This is problem because according to this structure, a longitudinal bias magnetic field having a desired magnitude is not applied to the free magnetic layer 24, and the free magnetic layer 24 cannot be put in a single-magnetic-domain state.

The side shield layers 35 may be composed of the material described in the first embodiment shown in FIG. 1. A NiFe alloy, a Co-based amorphous material, a Fe-M-O material, or the like may be used.

The bias underlayers 50 formed on the side shield layers 35 moderate or block magnetic interference between the hard bias layers 51 and the side shield layers 35. The bias underlayers 50 may be composed of an insulating material such as $Al_2O_3$, $SiO_2$ or a nonmagnetic material such as Ta. When the bias underlayers 50 are composed of Cr, the remanence ratio and the coercive force of the hard bias layer 51 are increased.

The hard bias layers 51 formed on the bias underlayers 50 are each a conventional permanent magnet layer such as CoPtCr or CoPt.

In the sixth embodiment shown in FIG. 6, the insulating layers 36 composed of an insulating material such as $Al_2O_3$ or $SiO_2$ are formed on the hard bias layers 51. This structure prevents the electrical current flowing from the upper shield layer 37 to the composite film 33 from shunting into the hard bias layers 51. Thus, a magnetic sensing element with high output can be obtained.

In this embodiment shown in FIG. 6, the insulating layers 34 are provided between the side faces 33a of the composite film 33 and the side shield layers 35 and between the hard bias layers 51 and the side faces 33a of the composite film 33. As is previously described with reference to FIG. 1, this structure prevents an electrical current to flow into the side shield layers 35 instead of the nonmagnetic material layer 23. This structure is particularly effective when the magnetic sensing element includes the nonmagnetic material layer 23 composed of an insulating material such as $Al_2O_3$ and is thus of a tunneling magnetoresistive type. Additionally, in this embodiment, the insulating layers 34 are also provided between the hard bias layers 51 and the side faces 33a of the composite film 33. According to this structure, the insulating layers 34 moderate a strong longitudinal bias magnetic field from the hard bias layers 51. As a result, the magnetization direction of the free magnetic layer 24 is prevented from being firmly pinned by the longitudinal bias magnetic field from the hard bias layer 51, and high sensitivity can be achieved. Particularly as the track become narrower, the read sensitivity dramatically drops if the free magnetic layer 24 as a whole is firmly magnetized by a strong longitudinal bias layer applied from the nonmagnetic material layer hard bias layers 51, which is a serious problem. In order to prepare for trends for ever-narrower tracks, the insulating layers 34 are preferably provided between the hard bias layers 51 and the side faces 33a of the composite film 33.

Seventh Embodiment

Figure 7:
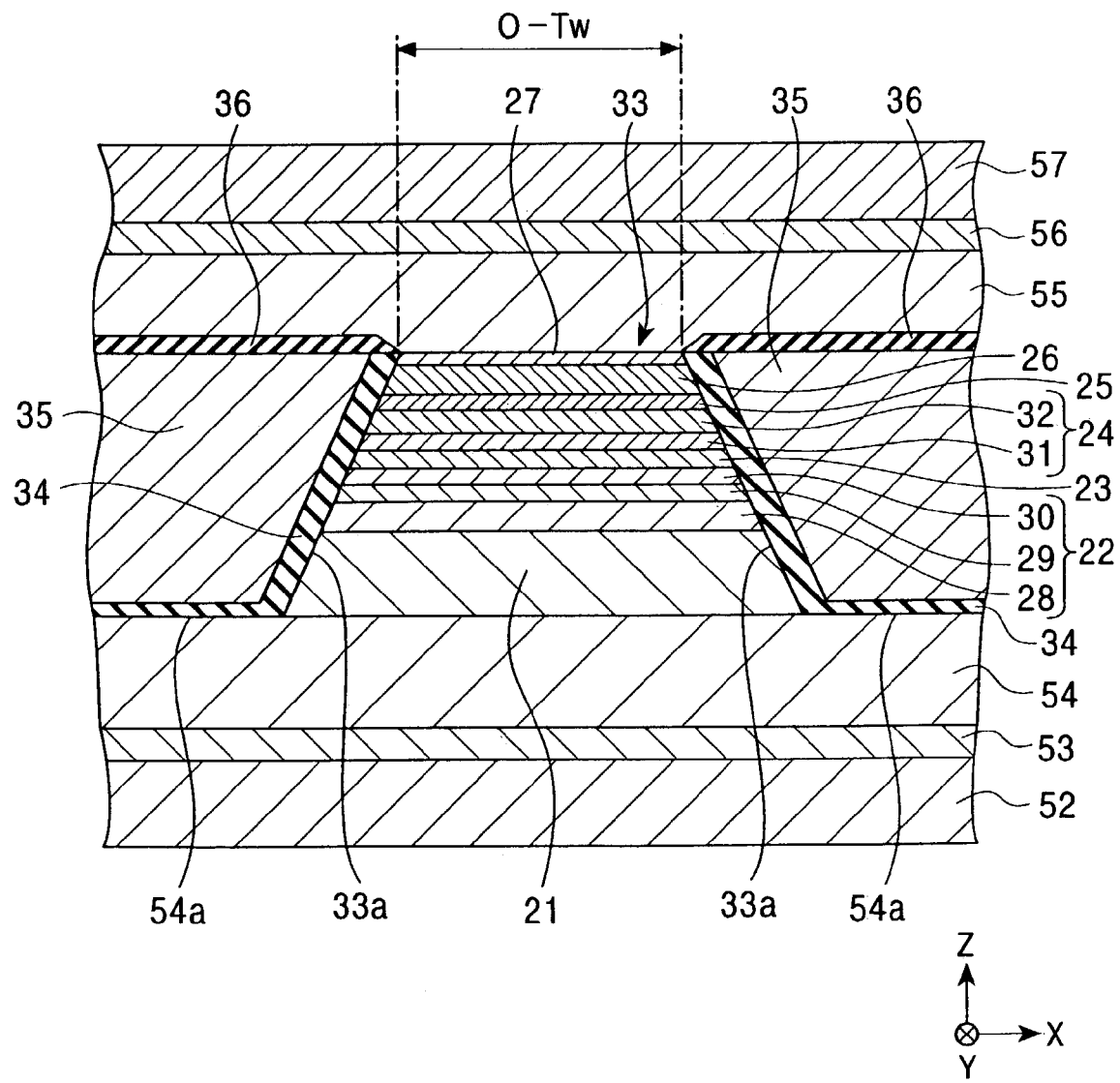
FIG. 7 is a cross-sectional view of a magnetic sensing element according to a seventh embodiment of the present invention viewed from the opposing face.

FIG. 7 is a cross-sectional view of a magnetic sensing element according to a seventh embodiment of the present invention viewed from the opposing face.

In this embodiment, a lower electrode layer 54 is disposed at the bottom of the composite film 33. The lower electrode layer 54 extends beyond the side faces 33a of the composite film 33. The side shield layers 35 are formed on portions of an upper face 54a of the lower electrode layer 54 not overlaid by the composite film 33. The side shield layers 35 are separated from the upper face 54a by the insulating layers 34 therebetween. The lower electrode layer 54 is composed of, for example, α-Ta, Au, Cr, Cu, or W.

As shown in FIG. 7, a lower gap layer 53 composed of $Al_2O_3$ is formed at the bottom of the lower electrode layer 54, and a lower shield layer 52 composed of a magnetic material is formed at the bottom of the lower gap layer 53.

Referring again to FIG. 7, an upper electrode layer 55 is formed on the composite film 33 and the side shield layers 35. An upper gap layer 56 composed of $Al_2O_3$ or the like is disposed on the upper electrode layer 55, and an upper shield layer 57 is disposed on the upper gap layer 56. As shown in FIG. 7, the insulating layers 36 composed of $Al_2O_3$ or the like are disposed between the upper electrode layer 55 and the side shield layers 35. The upper electrode layer 55 is composed of the same material as that of the lower electrode layer 54. For example, the upper electrode layer 55 is composed of α-Ta, Au, Cr, Cu, or W.

In this embodiment shown in FIG. 7, the lower electrode layer 54 and the upper electrode layer 55 are provided in addition to the opening 52 and the upper shield layer 57. Compared to the first to sixth embodiments shown in FIGS. 1 6 in which the lower shield layer 20 and the upper shield layer 37 also function as the electrode layers, the process of making the magnetic sensing element of the seventh embodiment is complicated. However, since the side shield layers 35 are disposed at the two sides of the composite film 33 in the track width direction (the X direction), an increase in the effective read track width can be minimized, and side reading can be effectively prevented.

Eighth Embodiment

Figure 8:
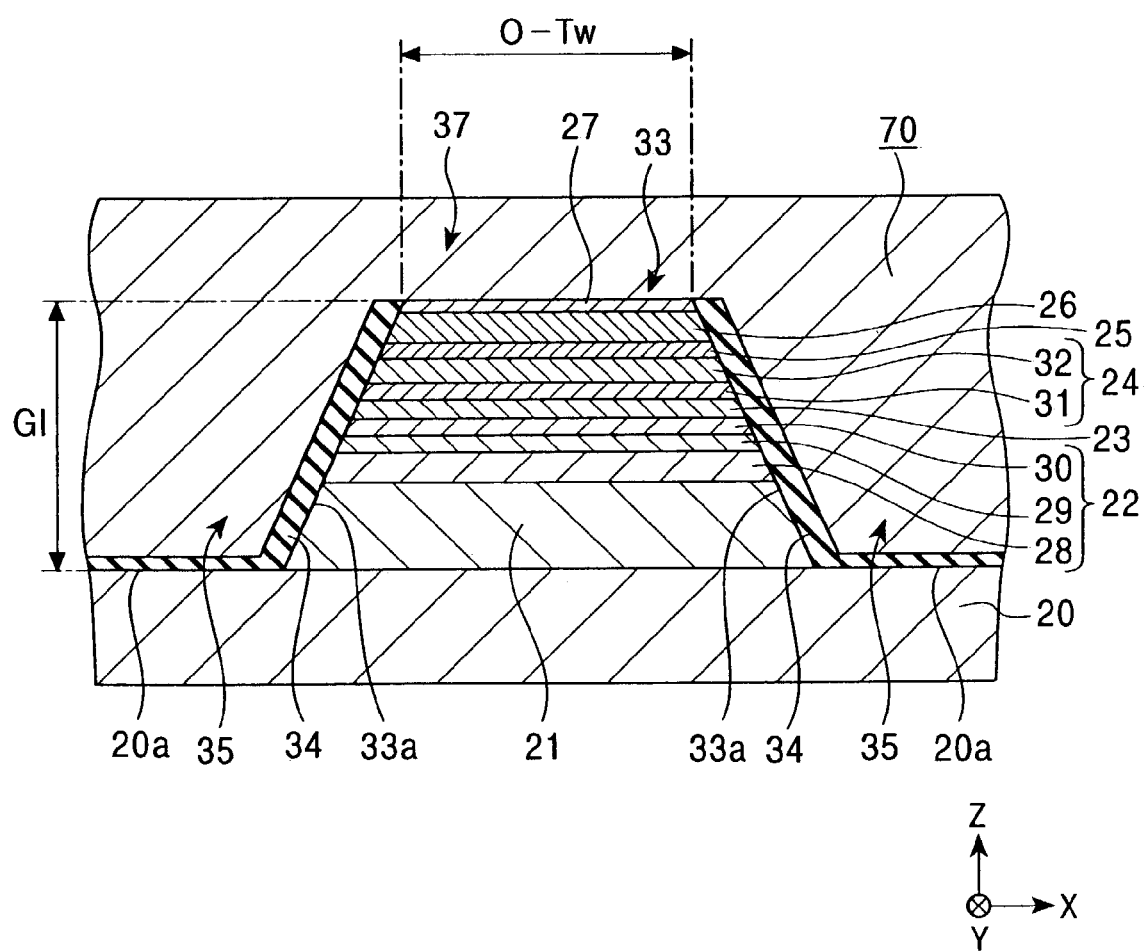
FIG. 8 is a cross-sectional view of a magnetic sensing element according to an eighth embodiment of the present invention viewed from the opposing face.

FIG. 8 is a cross-sectional view of a magnetic sensing element according to an eighth embodiment of the present invention viewed from the opposing face.

The layer structure of the composite film 33 is the same as that in the first embodiment shown in FIG. 1. The composite film 33 is formed on the lower shield layer 20, and the insulating layer 34 are formed on the two side faces 33a of the composite film 33 and part of the upper face 20a of the lower shield layer 20 not overlaid by the composite film 33.

A shield layer 70 is formed over the insulating layers 34 and the composite film 33. The side shield layers 35 and the upper shield layer 37 shown in FIG. 1 are integrated into the shield layer 70. According to this structure, the manufacturing process can be simplified compared to forming the side shield layers 35 separately from the upper shield layer 37.

The shield layer 70 may be composed of a NiFe alloy, the material that is generally used in shield layers. Alternatively, a magnetic material such as a Co-based amorphous material or Fe-M-O wherein M is at least one element selected from Ti, Zr, Hf, Nb, Ta, Cr, Mo, Si, P, C, W, B, Al, Ga, Ge, and rare earth elements. An example of Co-based amorphous material is a Co—X, wherein X is at least one element selected from Zr, Nb, Hf, Ta, Ti, Mo, W, P, Si, and B. The Fe-M-O material has a mixed-phase structure including both an amorphous phase and a bcc-Fe microcrystal phase.

The shield layer 70 may have a single-layer structure or a multilayer structure. When the shield layer 70 has a multilayer structure, the magnetic material such as the Co-based amorphous material or Fe-M-O need only be partially contained in the shield layer 70.

In FIG. 8, part of the shield layer 70 that functions as the upper shield layer 37 shown in FIG. 1 is in contact with the upper face of the composite film 33. In this embodiment, the part of the shield layer 70 that functions as the upper shield layer 37 also functions as the electrode layer.

Ninth Embodiment

Figure 9:
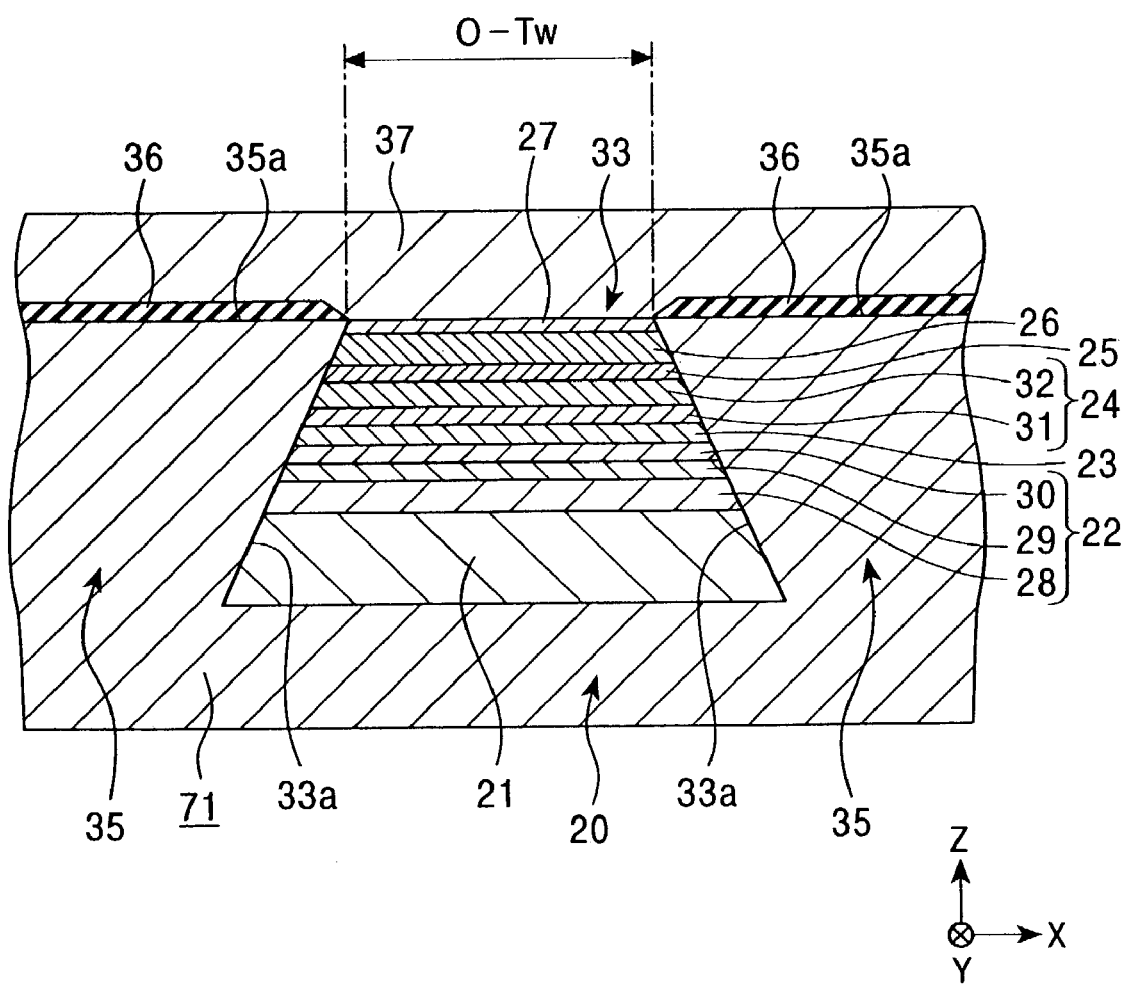
FIG. 9 is a cross-sectional view of a magnetic sensing element according to a ninth embodiment of the present invention viewed from the opposing face.

FIG. 9 is a cross-sectional view of a magnetic sensing element according to a first embodiment of the present invention viewed from the opposing face.

The composite film 33 of this embodiment shown in FIG. 9 has the same layer structure as that of the first embodiment shown in FIG. 1. In this embodiment, a shield layer 71 is formed at the bottom of and at the two sides of the composite film 33. In other words, the lower shield layer 20 and the side shield layers 35 shown in FIG. 1 are integrated into the shield layer 71.

The shield layer 71 is formed up to the upper face of the composite film 33. The insulating layers 36 are formed on the shield layer 71 at the two sides of the composite film 33 in the track width direction. The upper shield layer 37 is formed over the insulating layers 36 and the composite film 33.

The shield layer 71 may be composed of a NiFe alloy generally used as a shield layer. Alternatively, the shield layer 71 may be composed of a Co-based amorphous material or a magnetic material such as Fe-M-O, wherein M is at least one element selected from Ti, Zr, Hf, Nb, Ta, Cr, Mo, Si, P, C, W, B, Al, Ga, Ge, and rare earth elements. An example of Co-based amorphous material is Co—X, wherein X is at least one element selected from Zr, Nb, Hf, Ta, Ti, Mo, W, P, Si, and B. Fe-M-O has a mixed-phase structure including both an amorphous phase and a bcc-Fe microcrystal phase.

The shield layer 71 may have a single-layer structure or a multilayer structure. When the shield layer 71 has a multilayer structure, the Co-based amorphous material or Fe-M-O need only be partially contained in the shield layer 71.

In FIG. 9, part of the shield layer 71 that functions as the lower shield layer 20 shown in FIG. 1 is in contact with the composite film 33. In other words, the part of the shield layer 70 functioning as the lower shield layer 20 also functions as the lower electrode layer.

In the eighth and ninth embodiments shown in FIGS. 8 and 9 in which the side shield layers are integrated with the upper shield layer or the lower shield layer, the magnetization of the free magnetic layer 24 is controlled by, for example, the bias layer 26 composed of permanent magnet (also referred to as the "hard bias layer") formed on the free magnetic layer 24 with the nonmagnetic layer 25 therebetween.

The function of the bias layer 26 is previously described, and the detailed description thereof is omitted here.

In the eighth and ninth embodiments shown in FIGS. 8 and 9, the bias layer 26 must be stacked on the free magnetic layer 24 because hard bias layers cannot be disposed at the two sides of the free magnetic layer 24 in the track width direction.

Although the present invention is described herein using first to ninth embodiments shown in FIGS. 1 to 9, the structure of the magnetic sensing element of the present invention is not limited to these embodiments. The present invention can be applied to various other types of CPP magnetic sensing elements. For example, although the antiferromagnetic layer 21 is disposed at the bottom of the composite film 33, and the pinned magnetic layer 22, the nonmagnetic material layer 23, and the free magnetic layer 24 are sequentially stacked in that order, the stacking order may be reversed. Furthermore, the composite film 33 may be of a dual type. The structure of each layer of the composite film 33 may be any structure. For example, although the pinned magnetic layer 22 is illustrated as having a synthetic ferrimagnetic structure, the pinned magnetic layer 22 may be composed only from a magnetic material. The free magnetic layer 24 may have a synthetic ferrimagnetic structure.

When an exchange-coupled film constituted from an antiferromagnetic sublayer and a soft magnetic sublayer is used as a side shield layer, as with the side shield layer 42, the antiferromagnetic sublayer 40, and the soft magnetic sublayer 41 in the fifth embodiment, the order of stacking the antiferromagnetic sublayer (the antiferromagnetic sublayer 40) and the soft magnetic sublayer (the soft magnetic sublayer 41) may be reversed.

In the first to sixth, eighth, and ninth embodiments shown in FIGS. 1 to 6, 8, and 9, the lower shield layer 20 and the upper shield layer 37 also function as electrodes. Alternatively, a gap layer and an electrode layer may be provided in addition to the shield layer, as shown in FIG. 7. Alternatively, the shield layer may be electrically connected to the electrode layer.

The magnetic sensing element of the present invention may be incorporated into a thin-film magnetic head installed in a hard disk device, a magnetic head for reading tapes, a magnetic sensor, and the like.

Figure 10:
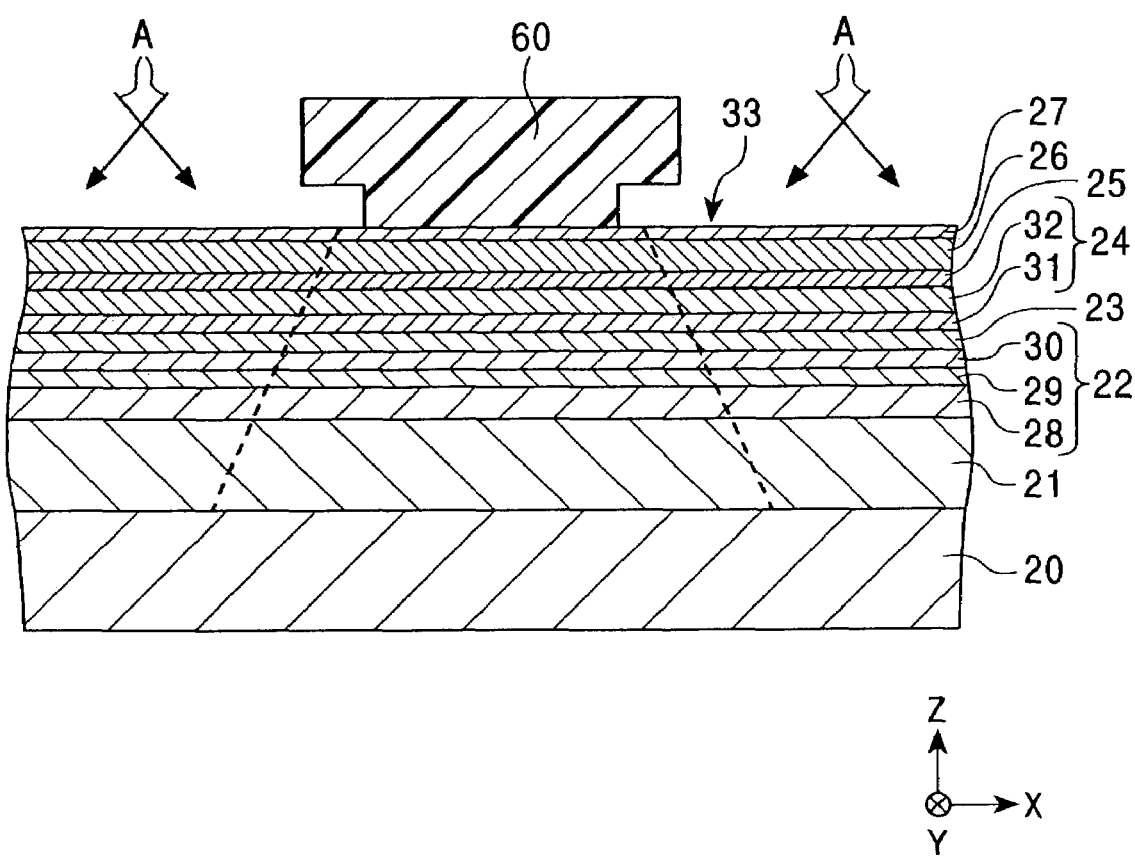
FIG. 10 is a cross-sectional view showing a step of making the magnetic sensing element shown in FIG. 1.
Figure 11:
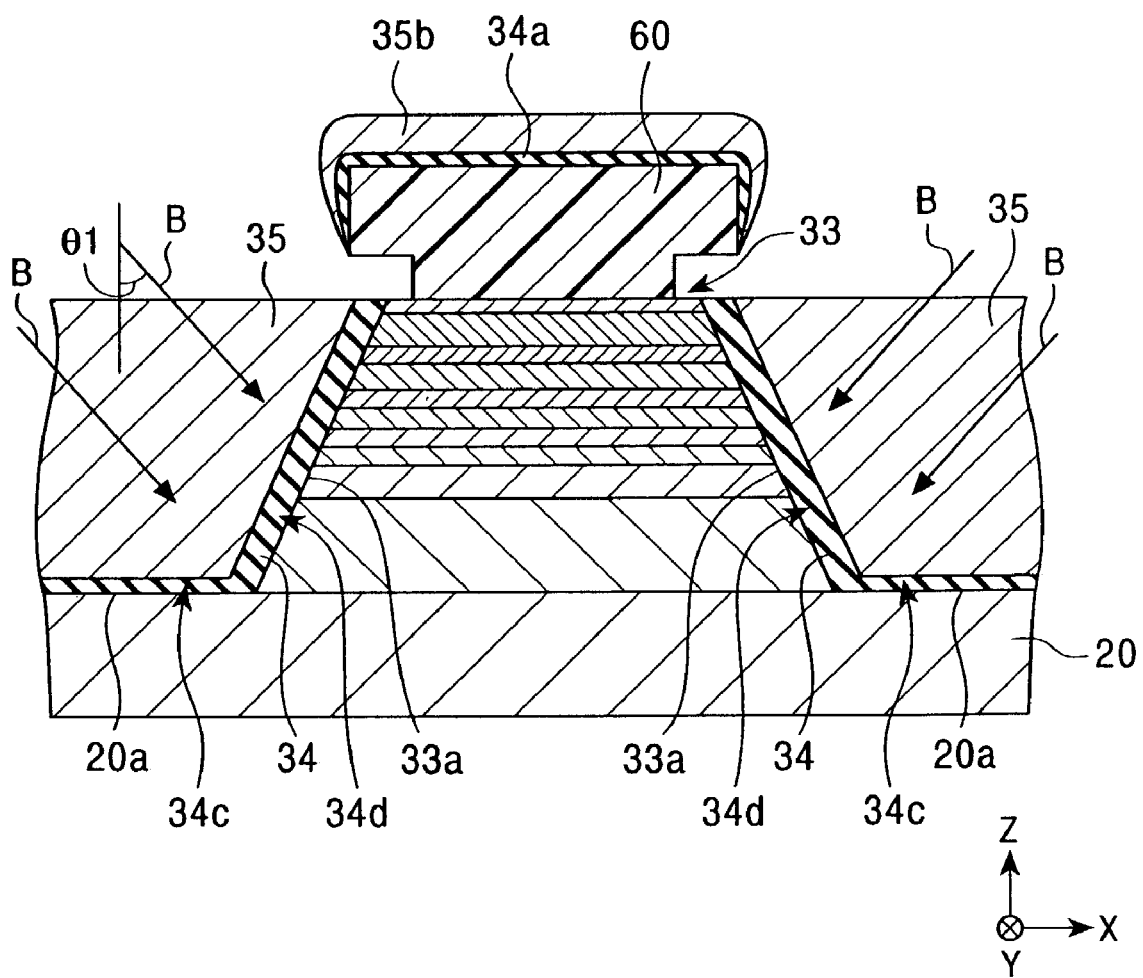
FIG. 11 is a cross-sectional view showing a step subsequent to the step shown in FIG. 10.
Figure 12:
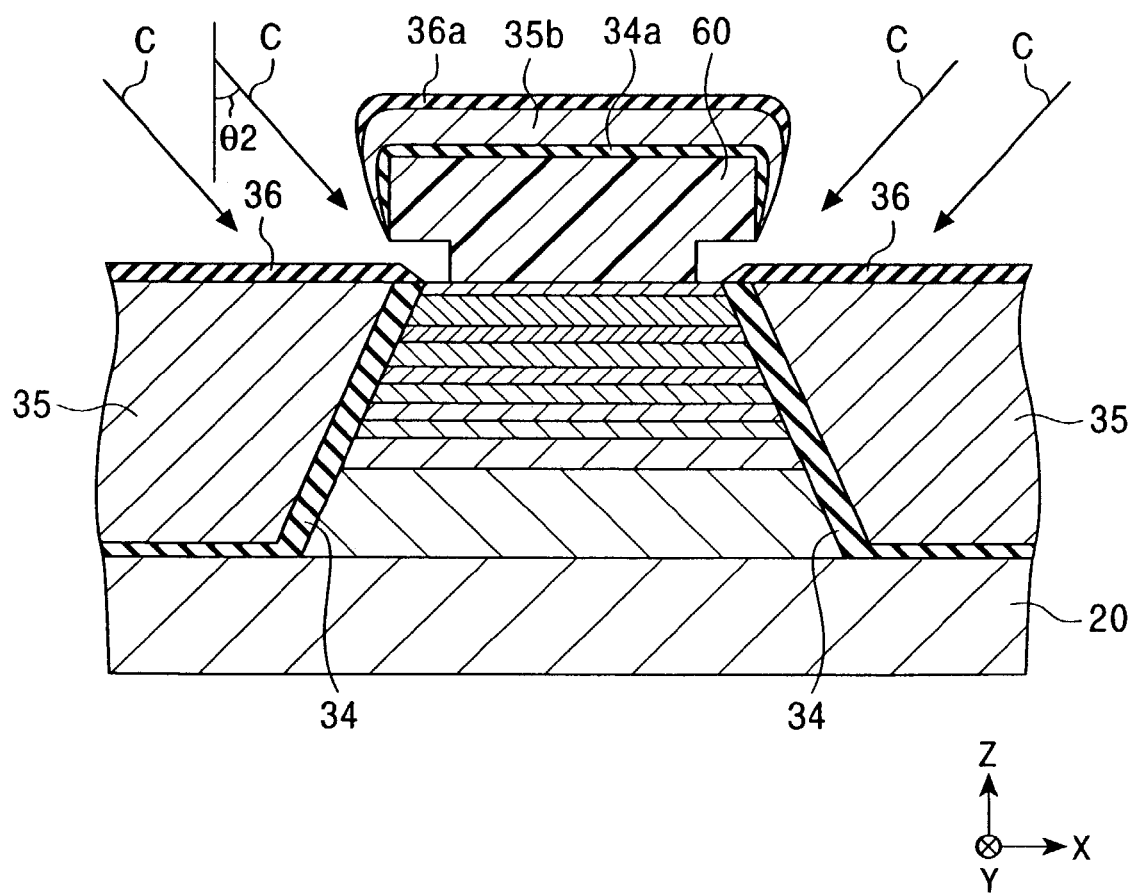
FIG. 12 is a cross-sectional view showing a step subsequent to the step shown in FIG. 11.

A method for making the magnetic sensing element of the first embodiment of the present invention shown in FIG. 1 will now be described. FIGS. 10 to 12 illustrate steps for making the magnetic sensing element of the first embodiment. Each of the drawings in FIGS. 10 to 12 is a cross-sectional partial view of the magnetic sensing element cut in a direction parallel to the opposing face.

In the step shown in FIG. 10, the antiferromagnetic layer 21, the pinned magnetic layer 22, the nonmagnetic material layer 23, the free magnetic layer 24, the nonmagnetic layer 25, the bias layer 26, and then the protective layer 27 are stacked on the lower shield layer 20. The lower shield layer 20 also functions as a lower electrode. These layers are made by sputtering or vapor deposition. Examples of sputtering methods include a DC magnetron sputtering method, a RF sputtering method, an ion beam sputtering method, a long throw sputtering method, and a collimation sputtering method.

In the present invention, the antiferromagnetic layer 21 is preferably composed of a Pt—Mn (platinum-manganese) alloy. Alternatively, the antiferromagnetic layer 21 may be composed of X—Mn or Pt—Mn—X', wherein X is at least one of Pd, Ir, Rh, and Ru and X' is at least one of Pd, Ir, Rh, Ru, Au, and Ag.

The Pt—Mn alloy or the X—Mn alloy preferably contains 37 to 63 at %, and more preferably 47 to 57 at % of Pt or X, respectively.

The Pt—Mn—X' alloy preferably contains 37 to 63 at %, and more preferably 47 to 57 at % of X'+Pt. The Pt—Mn—X' alloy preferably contains 0.2 to 10 at % of X'. When X' is at least one of Pd, Ir, Rh, Ru, Os, Ni, and Fe, the X' content is preferably in the range of 0.2 to 40 at %.

The thickness of the magnetic sublayer 32 is preferably in the range of 80 to 300 Å.

The pinned magnetic layer 22 has a synthetic ferrimagnetic structure and is formed by stacking the magnetic sublayer 28, the nonmagnetic interlayer 29, and the magnetic sublayer 30. The magnetic sublayers 28 and 30 are composed of, for example, a CoFe alloy. The nonmagnetic interlayer 29 is composed of, for example, Ru. The free magnetic layer 24 has a multilayer structure and is formed by stacking the magnetic sublayer 31 functioning as the anti-diffusion layer and the magnetic sublayer 32. The magnetic sublayer 31 is composed of, for example, a CoFe alloy. The magnetic sublayer 32 is composed of, for example, a NiFe alloy.

The nonmagnetic material layer 23 may be formed using a nonmagnetic conductive material such as Cu or an insulating material such as $Al_2O_3$ or $SiO_2$. When the nonmagnetic material layer 23 is composed of a nonmagnetic conductive material, a CPP spin-valve GMR head is made. When the nonmagnetic material layer 23 is composed of an insulating material, a CPP spin-valve tunneling magnetoresistive (TMR) head is made.

As shown in FIG. 10, the nonmagnetic layer 25 and the bias layer 26 are formed on the free magnetic layer 24. The nonmagnetic layer 25 is preferably formed using a nonmagnetic conductive material such as Ta or Cu. The bias layer 26 is preferably formed using a permanent magnet such as CoPtCr or CoPt. The bias layer 26 may be an exchange-coupled film comprising an antiferromagnetic sublayer and a soft magnetic sublayer.

In FIG. 10, in-magnetic-field annealing is preferably performed before the formation of the bias layer 26 so as to generate an exchange coupling magnetic field between the antiferromagnetic layer 21 and the magnetic sublayer 28 of the pinned magnetic layer 22. The generated exchange magnetic field pins the magnetization direction of the pinned magnetic layer 22 in the height direction (the Y direction in the drawing). When the bias layer 26 is an exchange-couple film comprising an antiferromagnetic sublayer and a soft magnetic sublayer, in-magnetic-field annealing is performed for the second time. The magnetic field applied during the second in-magnetic-field annealing is smaller than the exchange anisotropic magnetic field of the antiferromagnetic layer 21, and the heating temperature during the second in-magnetic-field annealing is lower than the blocking temperature of the antiferromagnetic layer 21. By the second in-magnetic-field annealing, the soft magnetic sublayer of the bias layer 26 is magnetized in the track width direction.

When the bias layer 26 is composed of a permanent magnet, the bias layer 26 is polarized in the track width direction (the X direction). This structure allows a longitudinal bias magnetic field applied from the soft magnetic sublayer and the permanent-magnet bias layer 26 to enter the free magnetic layer 24 and to magnetize the free magnetic layer 24 in the X direction.

In the step shown in FIG. 10, a resist layer is formed on the upper face of the protective layer 27. The resist layer is exposed and developed to form a resist layer 60 having a shape shown in FIG. 10 on the protective layer 27. The resist layer 60 is, for example, a lift-off resist layer.

Two side portions of the composite film 33 including layers from the antiferromagnetic layer 21 to the protective layer 27 not covered by the resist layer 60 are then removed by ion-milling in the arrow-A directions. As a result, the composite film 33 is milled along dotted lines in FIG. 10.

In the step shown in FIG. 11, the insulating layers 34 are formed by sputtering using an insulating material such as $Al_2O_3$ or $SiO_2$. The insulating layers 34 cover the side end faces 33a of the composite film 33 and portions of the top face 20a of the lower shield layer 20 not overlaid by the composite film 33.

The insulating layers 34 are formed by sputtering at a sputtering angle θ1 in the arrow-B direction in the drawing. The sputtering angle θ1 is an angle of sputtering with respect to the direction perpendicular to the surface of the lower shield layer 20, i.e., with respect to the axis of the Z direction. The sputtering angle θ1 is, for example, 30° to 70°.

When the sputtering angle θ1 is within the above described range, the insulating layers 34 readily adhere onto the side faces 33a of the composite film 33. In this manner, the thickness of insulating layers 34d on the side faces 33a of the composite film 33 is formed to be larger than the thickness of insulating layers 34c on the top face 20a of the lower shield layer 20.

Subsequent to the formation of the insulating layers 34, the side shield layers 35 are formed on the insulating layers 34 by, for example, sputtering.

The side shield layers 35 may be formed using a material, such as a NiFe alloy, generally used to form shield layers or a Co-based amorphous material or a magnetic material such as Fe-M-O, wherein M is at least one element selected from Ti, Zr, Hf, Nb, Ta, Cr, Mo, Si, P, C, W, B, Al, Ga, Ge, and rare earth elements. An example of the Co-based amorphous material is Co—X, wherein X is at least one element selected from Zr, Nb, Hf, Ta, Ti, Mo, W, P, Si, and B. Fe-M-O has a mixed-phase structure including both an amorphous phase and a bcc-Fe microcrystal phase.

The side shield layers 35 are deposited while applying a magnetic field (in-magnetic-field deposition) so as to provide uniaxial anisotropy to the side shield layer 35 in the track width direction (the X direction in the drawing). Alternatively, the side shield layers 35 may be annealed while applying a magnetic field (in-magnetic-field annealing) to provide uniaxial anisotropy. In such a case, the annealing temperature must be lower than the blocking temperature of the antiferromagnetic layer 21.

An insulating material layer 34a is deposited on the upper face of the resist layer 60 during deposition of the insulating layers 34, and a shield material layer 35b is deposited on the insulating material layer 34a during deposition of the side shield layers 35.

In the step shown in FIG. 12, the insulating layers 36 are deposited on the side shield layers 35 by sputtering using an insulating material such as $Al_2O_3$ or $SiO_2$. Sputtering is performed at a sputtering angle θ2 and in the arrow-C direction in the drawing. The sputtering angle θ2 is an angle with respect to the direction perpendicular to the surface of the lower shield layer 20, i.e., with respect to the axis of the Z direction in the drawing. The sputtering angle θ2 is, for example, 10° to 50°. The insulating layers 36 are formed to completely cover the side shield layers 35.

In the step shown in FIG. 12, an insulating material layer 36a is formed on the shield material layer 35b on the resist layer 60 during the deposition of the insulating layers 36. Subsequently, the resist layer 60 is removed.

The upper shield layer 37 is then formed over the insulating layers 36 and the protective layer 27 by plating. In forming the upper shield layer 37, a base layer composed of the same material as that of the upper shield layer 37 is formed by sputtering in advance, and the base layer is energized to allow a plating layer, i.e., the upper shield layer 37, to grow.

In order to make the magnetic sensing element of the second embodiment shown in FIG. 2, no insulating layers 34 are deposited in the step shown in FIG. 11. Instead, the side shield layers 35 are directly deposited over the top face 20a of the lower shield layer 20 and the side faces 33a of the composite film 33.

In order to make the magnetic sensing element of the third embodiment shown in FIG. 3, the sputtering angle θ1 is decreased so that hardly any material for the insulating layer 34 adheres onto the side faces 33a of the composite film 33 during the step shown in FIG. 11.

In order to make the magnetic sensing element of the fourth embodiment shown in FIG. 4, the first shield sublayers 43 and the second shield sublayers 44 are sequentially sputtered to make the side shield layers 45 during the step shown in FIG. 11.

In order to make the magnetic sensing element of the fifth embodiment shown in FIG. 5, in the step shown in FIG. 11, the insulating layers 34 are formed by sputtering, and the antiferromagnetic sublayers 40 are deposited on the insulating layers 34. Subsequently, the soft magnetic sublayers 41 are formed on the antiferromagnetic sublayers 40 by sputtering.

When the side shield layer 42 constituted from the antiferromagnetic sublayer 40 and the soft magnetic sublayer 41 is formed, the side shield layer 42 is annealed while applying a magnetic field to generate an exchange coupling magnetic field between the antiferromagnetic sublayer 40 and the soft magnetic sublayer 41. This step of annealing is not necessary in a case which an exchange coupling magnetic field is generated without annealing. For example, when the antiferromagnetic sublayer 40 is composed of an FeMn alloy or an IrMn alloy, an exchange coupling magnetic field can be generated by in-magnetic-field deposition; accordingly, annealing is not necessary.

During the in-magnetic-field annealing, the magnitude of the applied magnetic field should be smaller than the exchange coupling magnetic field between the antiferromagnetic layer 21 and the pinned magnetic layer 22 of the composite film 33. The annealing temperature should be lower than the blocking temperature of the antiferromagnetic layer 21.

When the bias layer 26 is an exchange-coupled film constituted from an antiferromagnetic sublayer and a soft magnetic sublayer, the magnitude of the applied magnetic field should be smaller than the exchange coupling magnetic field of the antiferromagnetic sublayer of the bias layer 26. The annealing temperature should be lower than the blocking temperature of the antiferromagnetic sublayer of the bias layer 26. It should be noted that no particular limitations are set when the direction of the exchange coupling magnetic field acting in the bias layer 26 is the same as the direction of the magnetic field applied during annealing.

In order to make the magnetic sensing element shown in FIG. 6, in the step shown in FIG. 11, the insulating layers 34 are formed over the top face 20a of the lower shield layer 20 and the side faces 33a of the composite film 33, the side shield layers 35 are formed on the insulating layers 34 by sputtering, and the bias underlayer 50 and the hard bias layer 51 are formed on each of the side shield layers 35.

In order to make the magnetic sensing element shown in FIG. 7, the lower shield layer 52 is first formed by plating. The lower gap layer 53 is then formed on the lower shield layer 52 by sputtering, and the lower electrode layer 54 is formed on the lower gap layer 53. Subsequently, the steps shown in FIGS. 10 to 12 are performed. After the step shown in FIG. 12, the upper electrode layer 55, the upper gap layer 56, and the upper shield layer 57 are formed.

Figure 13:
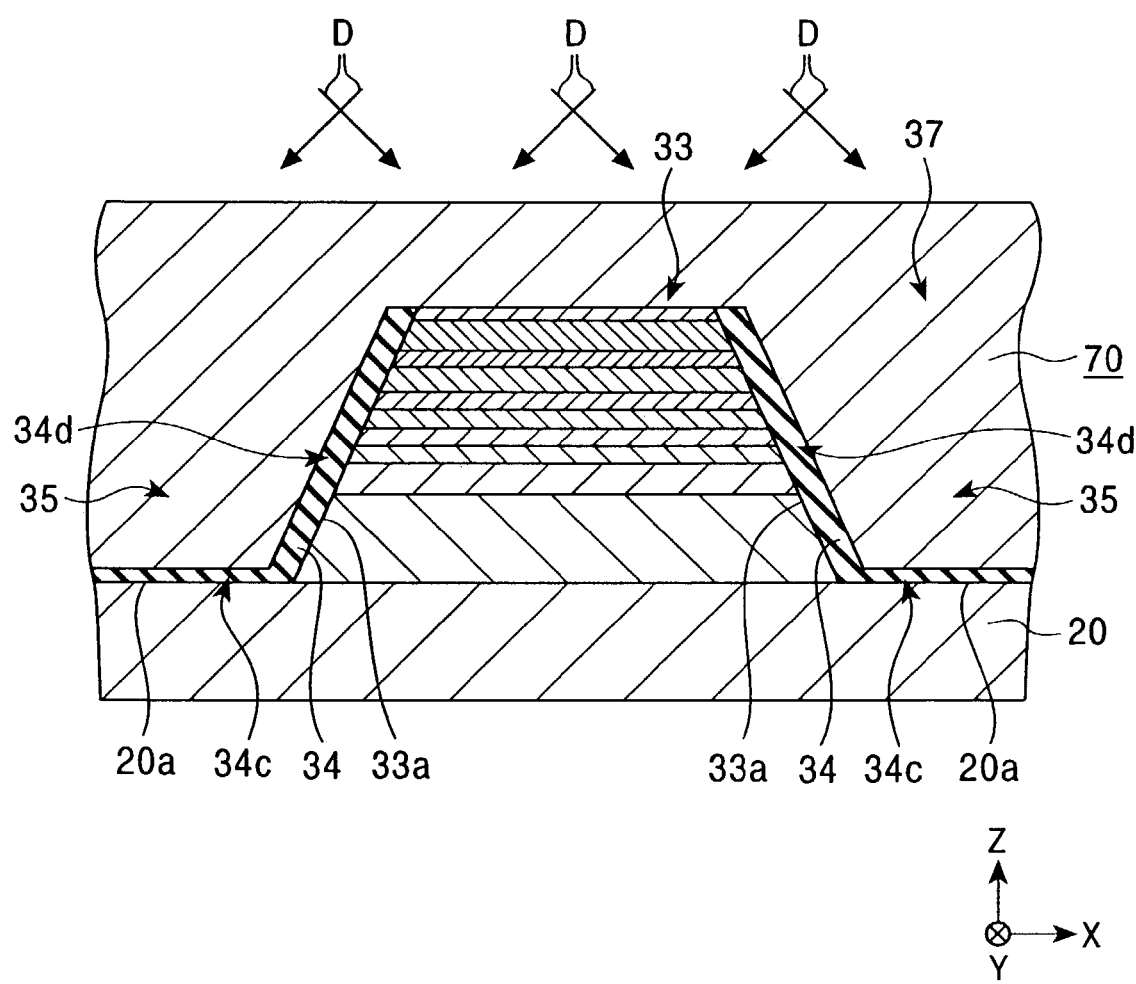
FIG. 13 is a cross-sectional view showing a step of making the magnetic sensing element shown in FIG. 8.

In order to make the magnetic sensing element shown in FIG. 8, subsequent to the step shown in FIG. 10, the insulating layers 34 are formed in the step shown in FIG. 11. Subsequently, the resist layer 60 shown in FIG. 11 is removed, and, in the step show in FIG. 13, the shield layer 70 integrating the side shield layer 35 and the upper shield layer 37 is formed over the two side faces 33a of the composite film 33 and the upper face of the composite film 33.

The process of making the magnetic sensing element of the eighth embodiment is simplified because the side shield layer 35 and are upper shield layer 37 are integrally formed in one step.

Each of the above-described methods successfully produce structures in which side shield layers are easily disposed at the two sides of the composite film 33 in the track width direction. These structures minimize an increase in effective read track width and prevent side reading.

EXAMPLE

Using the magnetic sensing element of the first embodiment shown in FIG. 1, the relationship between the thickness of each insulating layer 34 disposed between the side end face 33a of the composite film 33 and the side shield layer 35 and the effective read track width was determined by changing the thickness of the insulating layer 34 in the track width direction (EXAMPLE).

Figure 16:
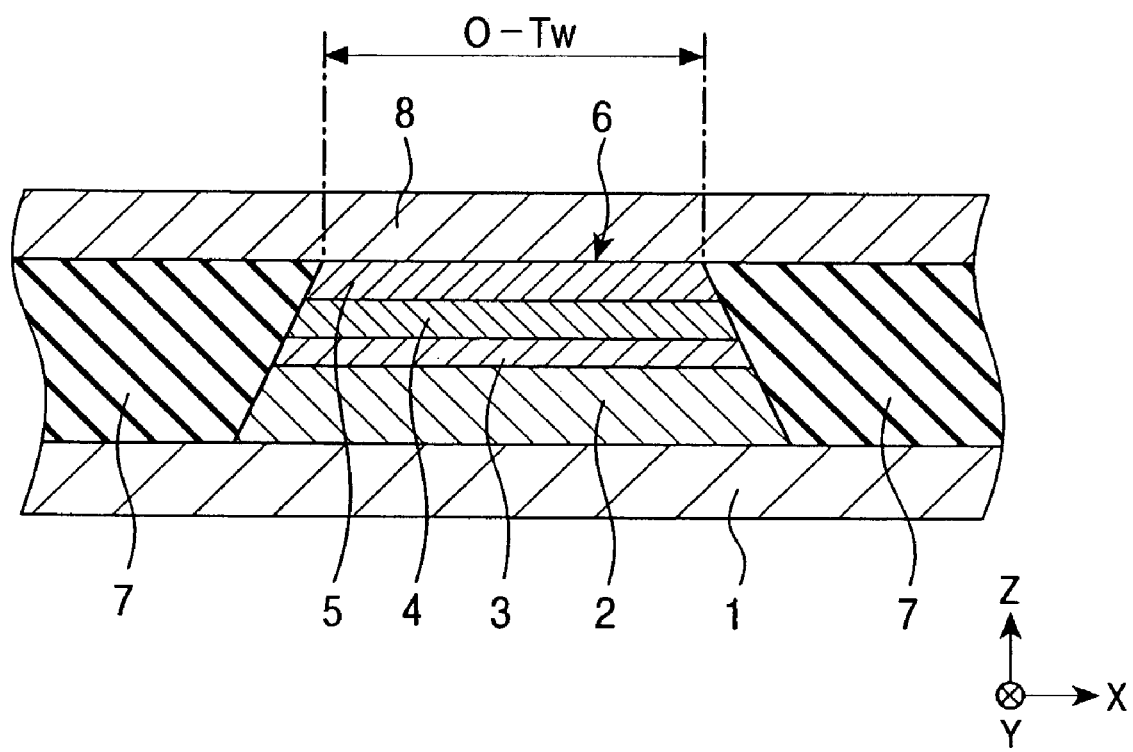
FIG. 16 is a partial cross-sectional view of a conventional CPP magnetic sensing element viewed from the opposing face.

For comparison, the effective read track width of a magnetic sensing element without side shield layers, as shown in FIG. 16, was determined as COMPARATIVE EXAMPLE.

First, dimensions and layer structures common to both the magnetic sensing elements of EXAMPLE and COMPARATIVE EXAMPLE are explained.

The optical track width O-Tw of EXAMPLE and COMPARATIVE EXAMPLE was set to 0.15 μm. The antiferromagnetic layer 21 was composed of PtMn, and the pinned magnetic layer 22 had a CoFe/Ru/CoFe synthetic ferrimagnetic structure. The nonmagnetic material layer 23 was composed of Cu. The bias layer 26 composed of permanent magnet was stacked on the free magnetic layer 24 with the nonmagnetic layer 25 therebetween so as to supply a longitudinal bias magnetic field to the free magnetic layer 24 (in-stack biasing method, see FIG. 1).

In the experiment, the thickness of the insulating layers 34 deposited on the side faces 33a of the composite film 33 in the magnetic sensing element of EXAMPLE (with side shield layers) was gradually changed. Meanwhile, the effective read track width was measured by the off-track profile method previously described with reference to FIG. 15.

Figure 14:
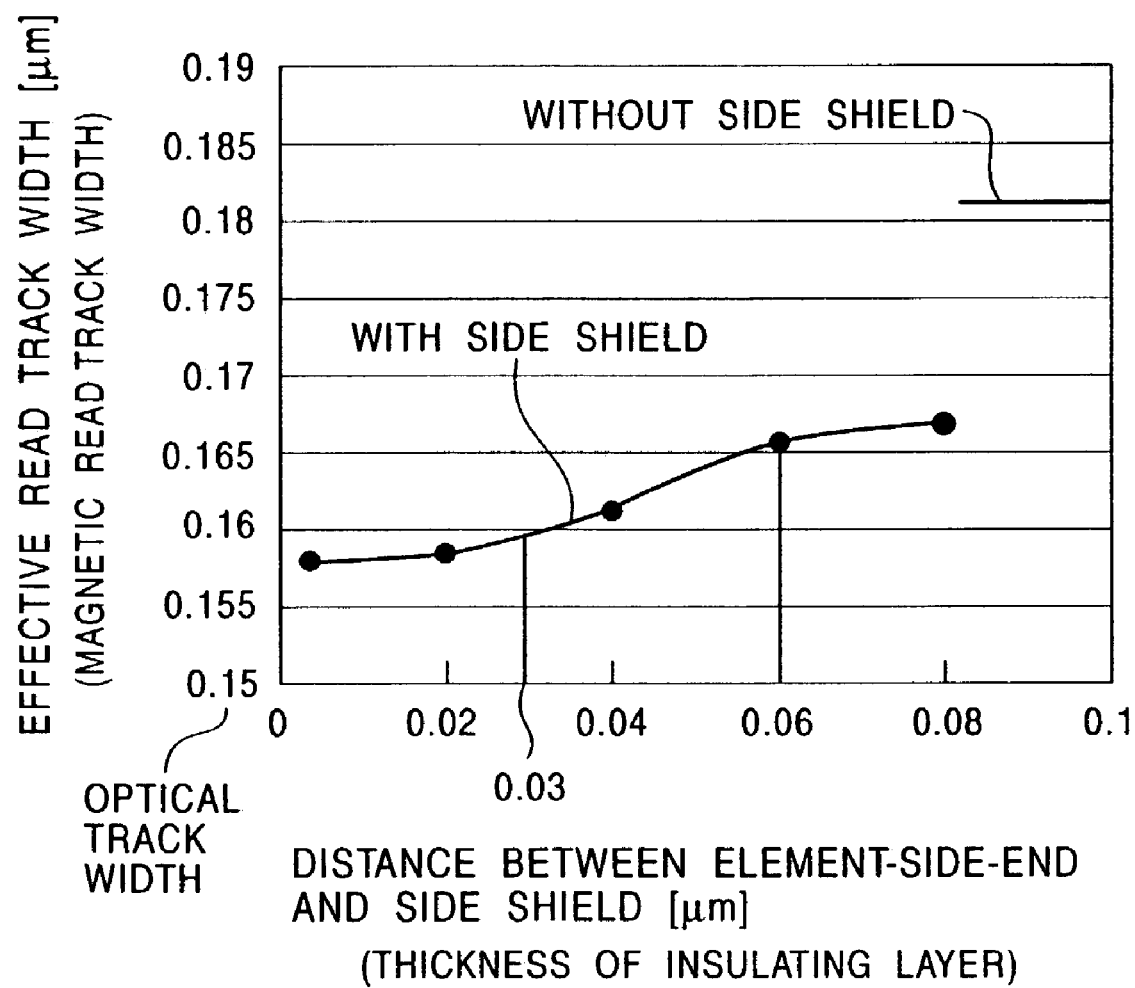
FIG. 14 is a graph showing the relationship between the effective read track width and the distance between a composite film and side shield layers of the CPP magnetic sensing element according to the present invention.

The relationship between the thickness of the insulating layers 34 and the effective read track width is shown in FIG. 14. FIG. 14 shows that the effective read track width increased as the thickness of the insulating layer 34 increased.

In contrast, the effective read track width of the magnetic sensing element of the COMPARATIVE EXAMPLE without side shield layers was significantly larger than that of the EXAMPLE.

As described above, the optical track width O-Tw was 0.15 μm. According to the graph shown in FIG. 14, the effective read track width subtracted by the optical track width O-Tw was 0.015 μm when the thickness of the insulating layers 34 was 0.06 μm. Thus, the effective read track width subtracted by the optical track width O-Tw can be reduced to 0.015 μm or less by reducing the thickness of the insulating layers 34 to 0.06 μm or less. In such a case, the effective read track width becomes 0.165 μm or less.

According to the graph shown in FIG. 14, the effective read track width subtracted by the optical track width O-Tw was 0.01 μm when the thickness of the insulating layers 34 was 0.03 μm (the effective read track width: 0.16 μm or less). Thus, the effective read track width subtracted by the optical track width O-Tw can be reduced to 0.01 μm or less by reducing the thickness of the insulating layers 34 to 0.03 μm or less.

The above-described experiment shows that by controlling the thickness of the insulating layers 34 within the above ranges, the increase in effective read track width can be properly minimized, and side reading can be effectively prevented.

What is claimed is:

1. A magnetic sensing element comprising:
   a composite film comprising an antiferromagnetic layer, a pinned magnetic layer, a nonmagnetic material layer, and a free magnetic layer, an electrical current flowing in the composite film in a direction perpendicular to a surface of each layer of the composite film;
   a lower shield layer disposed at a bottom of the composite film, the lower shield layer extending beyond two side faces of the composite film in a track width direction;
   an upper shield layer disposed at a top of the composite film, the upper shield layer extending beyond the two side faces of the composite film in the track width direction; and
   two side shield layers respectively disposed at the two side faces of the composite film between the lower shield layer and the upper shield layer,
   wherein each of the side shield layers comprises a magnetic material having a resistivity higher than those of the pinned magnetic layer and the free magnetic layer.

2. The magnetic sensing element according to claim 1, further comprising insulating layers disposed between the side shield layers and the side faces of the composite film.

3. The magnetic sensing element according to claim 2, wherein a thickness of each insulating layer in the track width direction is 0.003 μm to 0.06 μm.

4. The magnetic sensing element according to claim 2, wherein a thickness of each insulating layer in the track width direction is 0.003 μm to 0.03 μm.

5. The magnetic sensing element according to claim 1, wherein each of the side shield layers comprises a magnetic material different from at least one of magnetic materials constituting the upper shield layer and the lower shield layer.

6. The magnetic sensing element according to claim 1, wherein each of the side shield layers comprises at least one sublayer comprising a Co-based amorphous material.

7. The magnetic sensing element according to claim 1, wherein each of the side shield layers comprises at least one sublayer comprising a magnetic material represented by Fe-M-O, wherein M is at least one element selected from Ti, Zr, Hf, Nb, Ta, Cr, Mo, Si, P, C, W, B, Al, Ga, Ge, and rare earth elements.

8. The magnetic sensing element according to claim 1, wherein each of the side shield layers is an exchange-coupled film comprising an antiferromagnetic sublayer and a soft magnetic sublayer.

9. The magnetic sensing element according to claim 1, wherein the upper shield layer is in contact with an upper face of the composite film.

10. The magnetic sensing element according to claim 9, wherein insulating layers are disposed between the upper shield layer and the side shield layers.

11. The magnetic sensing element according to claim 1, wherein the lower shield layer is in contact with a lower face of the composite film.

12. The magnetic sensing element according to claim 11, wherein insulating layers are disposed between the lower shield layer and the side shield layers.

13. The magnetic sensing element according to claim 1, wherein the side shield layers are integrated with one of the upper shield layer and the lower shield layer to form an integrated shield layer.

14. The magnetic sensing element according to claim 13, wherein the integrated shield layer includes a magnetic region comprising a Co-based amorphous material.

15. The magnetic sensing element according to claim 13, wherein the integrated shield layer includes a magnetic region comprising a magnetic material represented by Fe-M-O, wherein M is at least one element selected from Ti, Zr, Hf, Nb, Ta, Cr, Mo, Si, P, C, W, B, Al, Ga, Ge, and rare earth elements.

16. The magnetic sensing element according to claim 13, wherein the upper shield layer is in contact with an upper face of the composite film.

17. The magnetic sensing element according to claim 13, wherein the lower shield layer is in contact with a lower face of the composite film.

18. The magnetic sensing element according to claim 1, the composite film further comprising:
   a nonmagnetic layer disposed on a face of the free magnetic layer remote from the non magnetic material layer; and
   a bias layer formed on the nonmagnetic layer.

19. The magnetic sensing element according to claim 1, wherein the nonmagnetic material layer comprises a nonmagnetic conductive material.

20. The magnetic sensing element according to claim 1, wherein the nonmagnetic material layer comprises an insulating material.

21. A magnetic sensing element comprising:
   a composite film comprising an antiferromagnetic layer, a pinned magnetic layer, a nonmagnetic material layer, and a free magnetic layer, an electrical current flowing in the composite film in a direction perpendicular to a surface of each layer of the composite film;
   a lower shield layer disposed at a bottom of the composite film, the lower shield layer extending beyond two side faces of the composite film in a track width direction;
   an upper shield layer disposed at a top of the composite film, the upper shield layer extending beyond the two side faces of the composite film in the track width direction; and
   two side shield layers respectively disposed at the two side faces of the composite film between the lower shield layer and the upper shield layer,
   wherein each of the side shield layers comprises a magnetic material different from at least one of magnetic materials constituting the upper shield layer and the lower shield layer.

22. The magnetic sensing element according to claim 21, further comprising insulating layers disposed between the side shield layers and the side faces of the composite film.

23. The magnetic sensing element according to claim 22, wherein a thickness of each insulating layer in the track width direction is 0.003 µm to 0.06 µm.

24. The magnetic sensing element according to claim 22, wherein a thickness of each insulating layer in the track width direction is 0.003 µm to 0.03 µm.

25. The magnetic sensing element according to claim 21, wherein each of the side shield layers comprises at least one sublayer comprising a Co-based amorphous material.

26. The magnetic sensing element according to claim 21, wherein each of the side shield layers comprises at least one sublayer comprising a magnetic material represented by Fe-M-O, wherein M is at least one element selected from Ti, Zr, Hf, Nb, Ta, Cr, Mo, Si, P, C, W, B, Al, Ga, Ge, and rare earth elements.

27. The magnetic sensing element according to claim 21, wherein each of the side shield layers is an exchange-coupled film comprising an antiferromagnetic sublayer and a soft magnetic sublayer.

28. The magnetic sensing element according to claim 21, wherein the upper shield layer is in contact with an upper face of the composite film.

29. The magnetic sensing element according to claim 28, wherein insulating layers are disposed between the upper shield layer and the side shield layers.

30. The magnetic sensing element according to claim 21, wherein the lower shield layer is in contact with a lower face of the composite film.

31. The magnetic sensing element according to claim 30, wherein insulating layers are disposed between the lower shield layer and the side shield layers.

32. The magnetic sensing element according to claim 21, wherein the side shield layers are integrated with one of the upper shield layer and the lower shield layer to form an integrated shield layer.

33. The magnetic sensing element according to claim 32, wherein the integrated shield layer includes a magnetic region comprising a Co-based amorphous material.

34. The magnetic sensing element according to claim 32, wherein the integrated shield layer includes a magnetic region comprising a magnetic material represented by Fe-M-O, wherein M is at least one element selected from Ti, Zr, Hf, Nb, Ta, Cr, Mo, Si, P, C, W, B, Al, Ga, Ge, and rare earth elements.

35. The magnetic sensing element according to claim 32, wherein the upper shield layer is in contact with an upper face of the composite film.

36. The magnetic sensing element according to claim 32, wherein the lower shield layer is in contact with a lower face of the composite film.

37. The magnetic sensing element according to claim 21, the composite film further comprising:
  a nonmagnetic layer disposed on a face of the free magnetic layer remote from the nonmagnetic material layer; and
  a bias layer formed on the nonmagnetic layer.

38. The magnetic sensing element according to claim 21, wherein the nonmagnetic material layer comprises a nonmagnetic conductive material.

39. The magnetic sensing element according to claim 21, wherein the nonmagnetic material layer comprises an insulating material.

* * * * *